(12) United States Patent
Kamiya

(10) Patent No.: US 8,074,142 B2
(45) Date of Patent: Dec. 6, 2011

(54) DECODING DEVICE AND RECEIVING DEVICE

(75) Inventor: Norifumi Kamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 924 days.

(21) Appl. No.: 12/088,142

(22) PCT Filed: Sep. 21, 2006

(86) PCT No.: PCT/JP2006/318728
§ 371 (c)(1),
(2), (4) Date: Mar. 26, 2008

(87) PCT Pub. No.: WO2007/034870
PCT Pub. Date: Mar. 29, 2007

(65) Prior Publication Data
US 2010/0153810 A1    Jun. 17, 2010

(30) Foreign Application Priority Data

Sep. 26, 2005  (JP) .................................. 2005-278429

(51) Int. Cl.
*G06F 11/00* (2006.01)
(52) U.S. Cl. ......................... 714/752; 714/755; 714/781
(58) Field of Classification Search .................. 714/752, 714/755, 781
See application file for complete search history.

(56) References Cited

U.S. PATENT DOCUMENTS

| 7,318,186 | B2 | 1/2008 | Yokokawa et al. | |
| 2005/0204271 | A1* | 9/2005 | Sharon et al. ................. | 714/801 |
| 2005/0283707 | A1* | 12/2005 | Sharon et al. ................. | 714/758 |
| 2007/0089019 | A1* | 4/2007 | Tang et al. .................... | 714/752 |
| 2009/0049357 | A1* | 2/2009 | Ueng et al. .................... | 714/752 |
| 2009/0063931 | A1* | 3/2009 | Rovini et al. ................. | 714/758 |
| 2010/0251063 | A1* | 9/2010 | Kamiya ........................ | 714/752 |

FOREIGN PATENT DOCUMENTS

| JP | 2004343170 | 12/2004 |
| JP | 200545735 | 2/2005 |

OTHER PUBLICATIONS

Robert G. Gallager, "Low Density Parity Check Codes", United States, MIT Press, 1963, pp. 1-3, 39-56.
David J.C. MacKay, "Good Error-Correcting Codes Based on Very Sparse Matrices", United States, IEEE Transactions on formation Theory, vol. 45, No. 2, Mar. 1999, pp. 399-431.
Jinghu Chen et al, "Near Optimum Universal Belief Propagation Based Decoding of Low-Density Parity Check Codes", United States, IEEE Transactions on Communications, vol. 50, No. 3, Mar. 2002, pp. 406-414.

(Continued)

*Primary Examiner* — Philip Guyton
(74) *Attorney, Agent, or Firm* — Sughrue Mion, PLLC

(57) ABSTRACT

A decoding apparatus for low density parity check codes includes a variable-to-check message generator and a check-to-variable message generator. The variable-to-check message generator includes a variable-to-check processing unit block, provided with an adder, and which is arranged between registers corresponding to locations of '1's in a check matrix. The check-to-variable message generator includes a check-to-variable processing unit block, provided with a comparator, between registers corresponding to locations of '1's in the check matrix. The decoding apparatus for low density parity check codes is simple in configuration and is able to perform high speed processing without using RAMs without the necessity of performing complex control operations.

16 Claims, 11 Drawing Sheets

OTHER PUBLICATIONS

Zhongfeng Wang et al., "Low Complexity, High Speed Decoder Architecture for Quasi-Cyclic LDPC Codes", IEEE International Symposium on Circuits and Systems, 2005. ISCAS 2005, vol. 6, May 23, 2005, pp. 5786-5789 N.

Christian Spagnol et al, "Reduced complexity, FGPA implementation of quasi-cyclic LDPC decoder", Proceedings of the 2005 European Conference on Circuit Theory and Design, vol. 1, Aug. 28, 2005, pp. 1/289-1/292.

* cited by examiner

DECODING DEVICE AND RECEIVING DEVICE

TECHNICAL FIELD

This invention relates to a decoding apparatus for block error correction in which a sequence of received data is divided into a plurality of blocks each of a preset length and a redundancy sequence is appended from block to block, and a receiving apparatus including the decoding apparatus. More particularly, it relates to a decoding apparatus for low density parity check (LDPC) codes, and a receiving apparatus including the decoding apparatus.

BACKGROUND ART

In satellite communication systems or mobile communication systems, an error correction coding technique, having a large code gain, is being introduced to meet requirements for system configurations, such as reduction of the required power or the antenna size. The low density parity check code is known as an error correction code having a very large code gain and is increasingly adopted for use in a variety of communication systems and recording devices, such magnetic recording devices.

The low density parity check code does not designate a single error correction coding system, but collectively denotes an error correction code system featured in that a check matrix is sparse, that is, elements of the check matrix are mostly 0, with the number of the elements 1 being extremely small.

The low density parity check code is featured by the fact that, by using an iterative decoding system, such as a sum-product algorithm or a min-sum algorithm, with selection of a sparse check matrix, an error correction coding system can be constructed which has an extremely large code gain close to a theoretical limit (see Non-Patent Publication 1 and Non-Patent Publication 2, for instance).

The decoding apparatus for the low density parity check code performs the operation of updating a variable-to-check message by a variable-node processor and the operation of updating a check-to-variable message by a check-node processor, in alternation with each other. After updating each message a preset number of times, the estimated result of the transmission data is obtained from the check-to-variable message and the received data (see Non-Patent Publication 2 and Non-Patent Publication 3, for instance).

Non-Patent Publication 1: Robert G. Gallager, 'Low Density Parity Check Codes', United States, MIT Press, 1963, pp. 39-56

Non-Patent Publication 2: David J. C. MacKay, 'Good Error-Correcting Codes Based on Very Sparse Matrices, United States, IEEE Transactions on formation Theory), Vol. 45, No. 2, March 1999, p 399-431

Non-Patent Publication 3: Jinghu Chen and Marc P. C. Fossorier, 'Near Optimum Universal Belief Propagation Based Decoding of Low-Density Parity Check Codes', United States, IEEE Transactions on Communications), Vol. 50, No. 3, March 2002, pp. 406-414

DISCLOSURE OF THE INVENTION

Problems to be Solved by the Invention

Among the technical problems of the decoding system of the low density parity check codes, there are problems such that many random access memories (RAMs) are needed, and such that the RAM access speed puts limitations on the speed of the decoding processing as a whole.

Specifically, the processing of decoding the low density parity check codes includes message update by two sorts of the processing devices, and a memory for storing temporally messages is indispensable. There are a number of messages proportionate to the number of '1's in the check matrix and, if these messages are retained in the RAM as the storage device, many RAMs are needed, and hence there is raised a problem that the RAM access speed puts limitations on the speed of the decoding processing.

There is also a problem that, if the number of RAMs is to be reduced, limitations are put on the number of messages that can be accessed simultaneously. Hence, there arises the necessity that the message update schedule or the address generation needs to be adjusted finely, thus complicating device constitution.

Accordingly, it is an object of the present invention to provide a decoding apparatus of a simplified structure and a small size, capable of speedily decoding the low density parity check codes, and a receiving apparatus including the decoding apparatus.

Means to Solve the Problems

According to the present invention, there is provided a decoding apparatus for decoding pseudo cyclic low density parity check codes in error correction coding and for outputting an estimated transmission bit sequence as the result of decoding, which comprises variable-to-check message generating means, check-to-variable message generating means, and normalization processing means. The variable-to-check message generating means includes a plurality of feedback shift registers of a predetermined number of stages including a plurality of registers, variable-to-check message generating means receiving a sequence of received data, generating and outputting a variable-to-check message and an estimated transmission bit sequence. The variable-to-check message is data including the sum of a log likelihood ratio and an a-priori value. The check-to-variable message generating means includes a plurality of feedback shift registers of a preset number of stages including a plurality of registers. The check-to-variable message generating means outputs, on receipt of the variable-to-check message, output from the variable-to-check message generating means, a check-to-variable message inclusive of data generated responsive to the variable-to-check message received. The normalization processing means for multiplying preset data included in the check-to-variable message output by the check-to-variable message generating means with a preset constant and for outputting the resulting product to the variable-to-check message generating means. The variable-to-check message generating means includes variable-to-check processing means for summing data corresponding to an output of the check-to-variable message generating means to preset data out of data retained in the registers of the feedback shift register included in the variable-to-check message generating means, and for saving the resulting sum in the next stage register. The variable-to-check processing means outputs, at a preset timing, the estimated transmission bit sequence and the variable-to-check message including data retained in the register. The check-to-variable message generating means includes check-to-variable processing means for selecting two data out of the data retained by the registers of the feedback shift register of the check-to-variable message generating means, and data of the smallest value and data of the second smallest value out of the data output by the variable-to-check processing means, for saving the data selected in the next stage register and for outputting the data retained in the register at a preset timing as a check-to-variable message. The variable-to-check message generating means is arranged between the registers of the feedback shift register of the check-to-variable message generating means. The check-to-variable message generating means is arranged between the registers of the feedback shift register of the check-to-variable message generating means.

The variable-to-check message generating means may include a first clock counter synchronized with an operating clock of the feedback shift register of the variable-to-check message generating means. The check-variable message generating means includes a second clock counter synchronized with an operating clock of the feedback shift register of the check-to-variable message generating means. The variable-to-check processing means selects, responsive to a count value of the first clock counter, the data to be summed to a part of the data retained in the register of the variable-to-check message generating means. The register of the check-to-variable message generating means retains a count value of the second clock counter. The check-to-variable processing means outputs, when data corresponding to the output of the variable-to-check message generating means has become of the smallest value, a numerical value corresponding to the count value of the second clock counter retained by the register, and causes the output value to be retained in the next stage register.

The variable-to-check message generating may mean includes a first clock counter synchronized with an operating clock of the feedback shift register of the variable-to-check message generating means. The check-variable message generating means includes a second clock counter synchronized with an operating clock of the feedback shift register of the check-to-variable message generating means. The variable-to-check processing means selects, responsive to a count value of the first clock counter and a numerical value allocated to the register of feedback shift register of the variable-to-check message generating means, the data to be summed to a part of the data retained in the register of the variable-to-check message generating means. The register of the check-to-variable message generating means retains a count value of the second clock counter. The check-to-variable processing means outputs, when data corresponding to the output of the variable-to-check message generating means has become of the smallest value, a set of the count value of the second clock counter retained by the register and a numerical value allocated to the register of the variable-to-check message generating means.

The variable-to-check message generating means and the check-to-variable message generating means may reiterate generation and outputting of the variable-to-check message and generation and outputting of the check-to-variable message a preset number of times. The variable-to-check message generating means outputs an estimated transmission bit sequence after repeating the generation of the variable-to-check message the preset number of times.

The variable-to-check message generating means may include the same numbers of the registers and the check-to-variable processing means as the size of a cyclic matrix constituting a check matrix of pseudo cyclic low density parity check codes. Preferably, the variable-to-check message generating means includes the same numbers of the registers and the check-to-variable processing means as the size of a cyclic matrix constituting a check matrix of pseudo cyclic low density parity check codes. The check-to-variable message generating means includes the same numbers of the registers and the check-to-variable processing means as the size of a cyclic matrix constituting a check matrix of the pseudo cyclic low density parity check codes.

According to the present invention, there is provided a receiving apparatus including a decoding apparatus for decoding pseudo cyclic low density parity check codes in error correction coding and for outputting an estimated transmission bit sequence, which comprises a demodulator for demodulating and outputting the information received, and a synchronization control-data conversion device for converting output data of the demodulator into input data of a form matched to the decoding apparatus. The decoding apparatus includes variable-to-check message generating means in turn including a plurality of feedback shift registers of a predetermined number of stages including a plurality of registers. The variable-to-check message generating means receives a sequence of received data, generating and outputting a variable-to-check message and an estimated transmission bit sequence. The variable-to-check message is data having the sum of a log likelihood ratio and an a-priori value. The decoding apparatus also includes check-to-variable message generating means in turn including a plurality of feedback shift registers of a preset number of stages including a plurality of registers. The check-to-variable message generating means outputs, on receipt of the variable-to-check message, output from the variable-to-check message generating means, a check-to-variable message inclusive of data generated responsive to the variable-to-check message received. The decoding apparatus also includes normalization processing means for multiplying preset data included in the check-to-variable message output by the check-to-variable message generating means with a preset constant and for outputting the resulting product to the variable-to-check message generating means. The variable-to-check message generating means includes variable-to-check processing means for summing data corresponding to an output of the check-to-variable message generating means to preset data out of data retained in the registers of the feedback shift register included in the variable-to-check message generating means, and for saving the resulting sum in the next stage register. The variable-to-check processing means outputs, at a preset timing, the estimated transmission bit sequence and the variable-to-check message including data retained in the register. The check-to-variable message generating means includes check-to-variable processing means for selecting two data out of the data retained by the registers of the feedback shift register of the check-to-variable message generating means, and data of the smallest value and data of the second smallest value out of the data output by the variable-to-check processing means, for saving the data selected in the next stage register and for outputting the data retained in the register at a preset timing as check-to-variable message. The variable-to-check message generating means is arranged between the registers of the feedback shift register of the check-to-variable message generating means. The check-to-variable message generating means is arranged between the registers of the feedback shift register of the check-to-variable message generating means.

Meritorious Effects of the Invention

According to the present invention, in which a storage device for storing temporally messages (RAM) is not used, it is possible to effect decoding of low density parity check codes at a high speed. In addition, RAM address generation and control are unneeded, thereby simplifying control and configuration.

In case the check-to-variable arithmetic operating unit is configured for outputting a numerical value corresponding to a count value of the second clock counter retained by a register when data corresponding to the output of the variable-to-check generating means has become of the smallest value, the decoding apparatus in its entirety may be reduced in size.

Also, in case the check-to-variable arithmetic operating unit is configured for outputting a set of a count value of the second clock counter retained by a register and a numerical value allocated to a register of variable-to-check generating means when data corresponding to the output of the variable-to-check generating means has become of the smallest value, it is possible to generate a check-to-variable message to high accuracy.

EXPLANATIONS OF SYMBOLS

Figure 1:
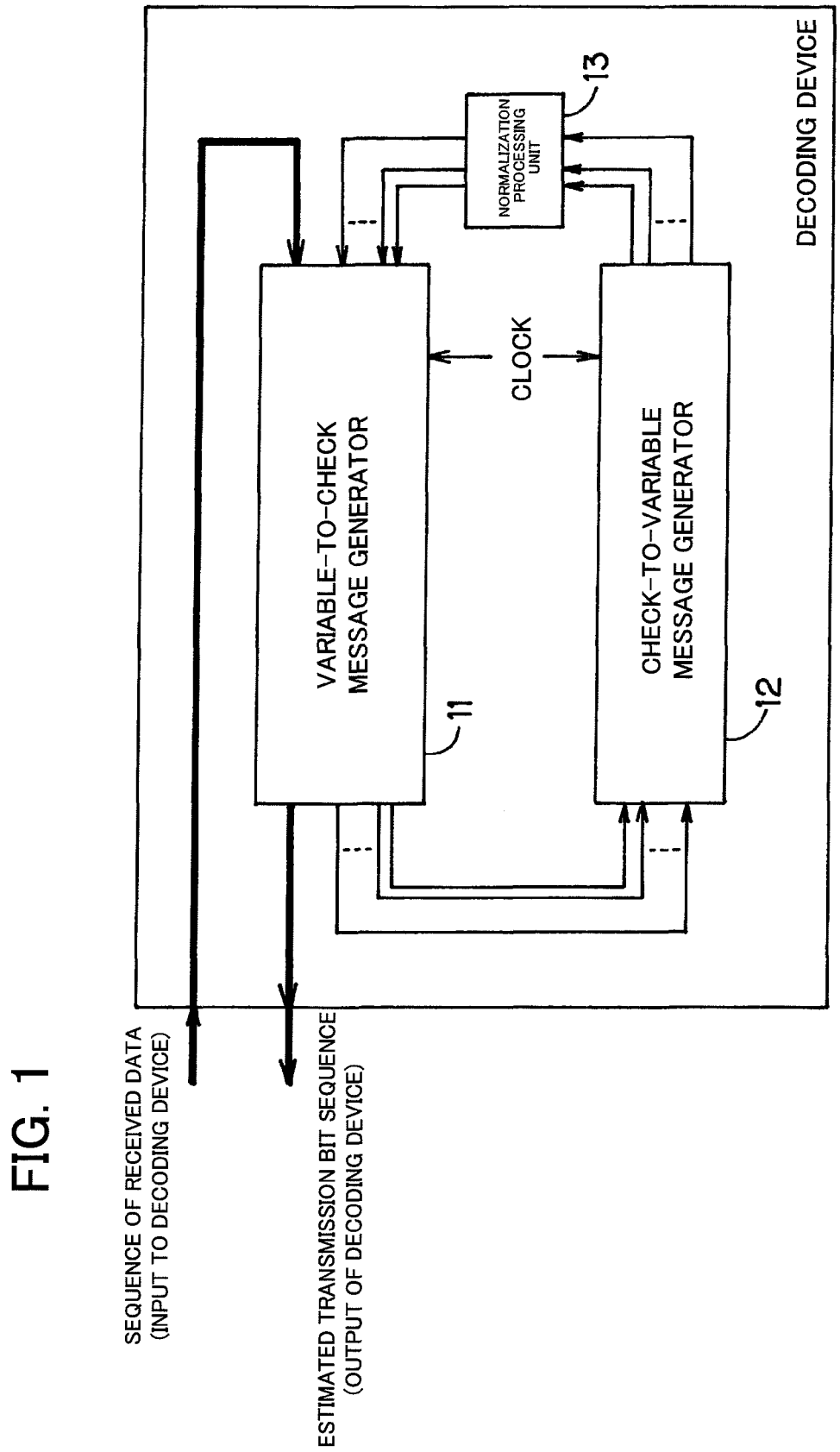
FIG. 1 is a block diagram showing an example of the configuration of a first exemplary embodiment of a decoding apparatus according to the present invention.

11 variable-to-check message generator
12 check-to-variable message generator
13 normalization processing unit
21 variable-to-check register block
22, 52 counter blocks
23, 41, 101 adders
31, 61 registers
32 variable-to-check processing unit block
33, 63 connection switches
34, 64 output switches
42, 102 plus-minus inverters
43, 73, 74, 113 selectors
44, 71, 72, 111, 112 comparators
45, 75, 103, 114 XOR gates
51 check-to-variable processing unit block
81 variable node processor
82 address generator controller
83 check node processor
84 message memory block
121 data transmitting device
122 encoding device
123, 127 synchronization control-data converter
124 modulation unit
125 data receiving apparatus
126 demodulator
128 decoding apparatus

PREFERRED MODES FOR CARRYING OUT THE INVENTION

First Exemplary Embodiment

A first exemplary embodiment of a decoding apparatus of the present invention is now described with reference to the drawings. FIG. 1 is a block diagram showing the first exemplary embodiment of the decoding apparatus according to the present invention.

The decoding apparatus according to the present invention includes a variable-to-check message generator (variable-to-check message generating means) 11, a check-to-variable message generator (check-to-variable message generating means) 12 and a normalization processing unit (normalization processing means) 13.

A sequence of received data is supplied to the variable-to-check message generator 11 from a communication network to which the decoding apparatus is connected. Since in general there is an error in the received data due to noise, for example, the decoding apparatus estimates a transmitted bit sequence, and outputs an estimated transmitted bit sequence.

The pseudo cyclic low density parity check codes are featured by the form of a check matrix. The check matrix of the pseudo cyclic low density parity check codes is an axa block matrix having, as an element, an axa cyclic matrix, as shown in the equation (1):

[Equation 1]

$$H = \begin{pmatrix} H_{0,0} & H_{0,1} & H_{0,2} & \cdots & H_{0,n-1} \\ H_{1,0} & H_{1,1} & H_{1,2} & \cdots & H_{1,n-1} \\ H_{2,0} & H_{2,1} & H_{2,2} & \cdots & H_{2,n-1} \\ \vdots & \vdots & \vdots & & \vdots \\ H_{m-1,0} & H_{m-1,1} & H_{m-1,2} & \cdots & H_{m-1,n-1} \end{pmatrix} \quad (1)$$

where a, m and n denote positive integers.

It is observed that $H_{i,j}$ of the equation (1) denotes the axa cyclic matrix shown by the following equation (2):

[Equation 2]

$$H_{i,j} = \begin{pmatrix} f_0^{(i,j)} & f_1^{(i,j)} & \cdots & f_{a-1}^{(i,j)} \\ f_1^{(i,j)} & f_2^{(i,j)} & \cdots & f_0^{(i,j)} \\ \vdots & \vdots & \ddots & \vdots \\ f_{a-1}^{(i,j)} & f_0^{(i,j)} & \cdots & f_{a-2}^{(i,j)} \end{pmatrix} \quad (2)$$

where i denotes an integer from 0 to m−1 and j denotes an integer from 0 to n−1.

With the cyclic matrix, the row vector of the second row is obtained on shifting the row vector of the first row by one bit towards left and so on so that the row vector of the k'th (where k is an integer not less than 2 and not more than 2) row is obtained on shifting the row vector of the l'th row by k−1 bits towards left.

The decoding apparatus of the pseudo cyclic low density parity check codes, the check matrix of which is the matrix of the equation (1), is now described.

The sequence of data received from the communication network, is supplied to the variable-to-check message generator 11. The output of the check-to-variable message generator 12 is also supplied to the variable-to-check message generator via the normalization processing unit 13. The output of the check-to-variable message generator 12 includes data sequences classified into the same number of sorts as the number m of the row blocks of the check matrix. The output of the check-to-variable message generator 12 will be described subsequently.

Figure 2:
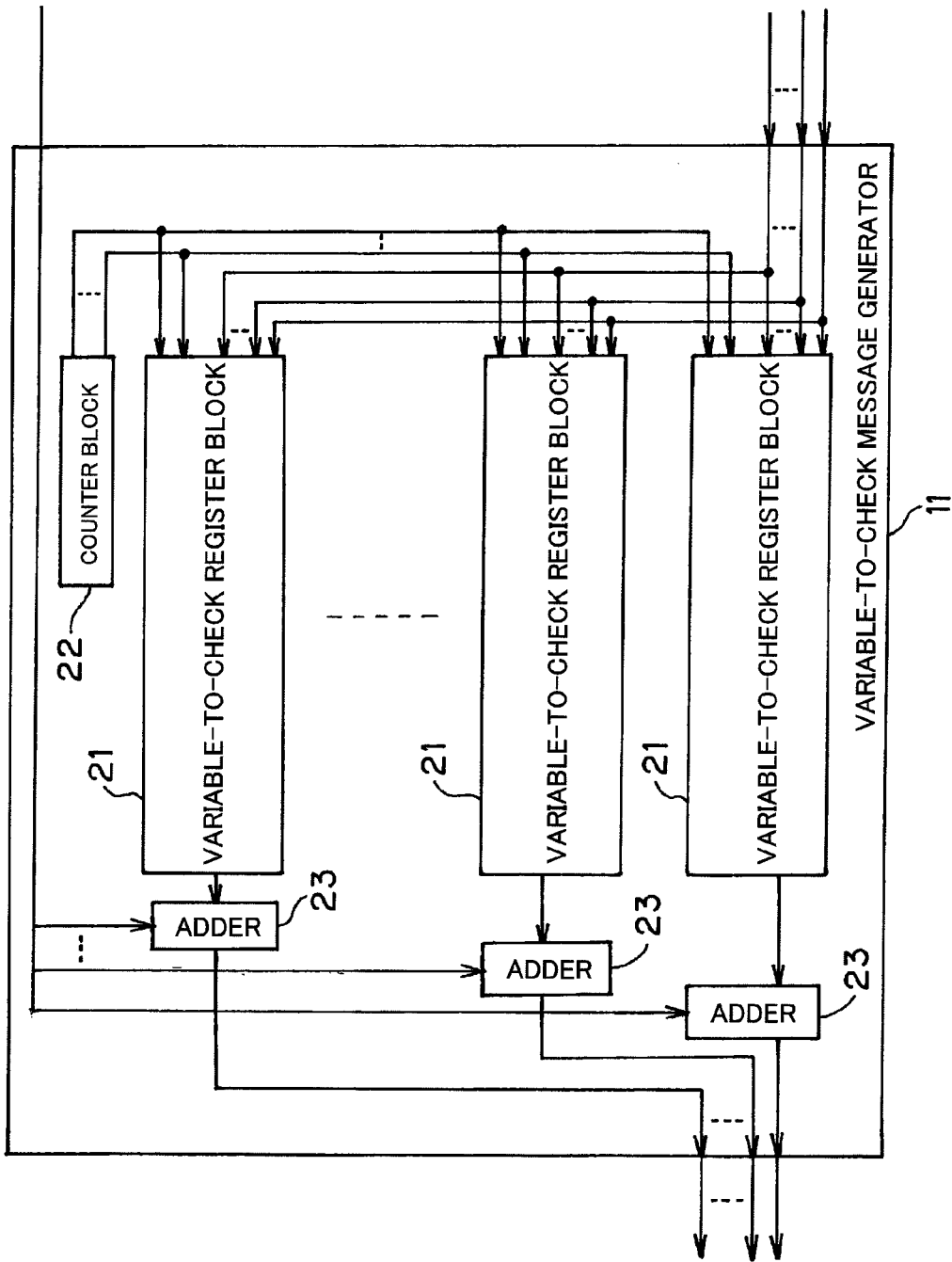
FIG. 2 is a block diagram showing an example of the configuration of a variable-to-check message generator.

FIG. 2 is a block diagram showing an example of the configuration of the variable-to-check message generator 11. The variable-to-check message generator 11 includes a number of variable-to-check register blocks 21 equal to the total number n of column blocks of the check matrix, adders 23, and a counter block (first clock counter) 22, which is a counter synchronized with the clock of a register 31 provided in the variable-to-check register block 21.

Each variable-to-check register block 21 is supplied with the output of the check-to-variable message generator 12 via the normalization processing unit 13. An output of each variable-to-check register block 21 is summed at an adder 23 to a part of the sequence of received data corresponding to a column block of the check matrix associated with the variable-to-check register block 21. The result of the addition become the output of the variable-to-check message generator 11. The number of the variable-to-check register blocks 21 is the same as the total number n of the column blocks of the check matrix, and the outputs of the variable-to-check message generator 11 are n sequences corresponding to the outputs of the variable-to-check register blocks 21.

Figure 3:
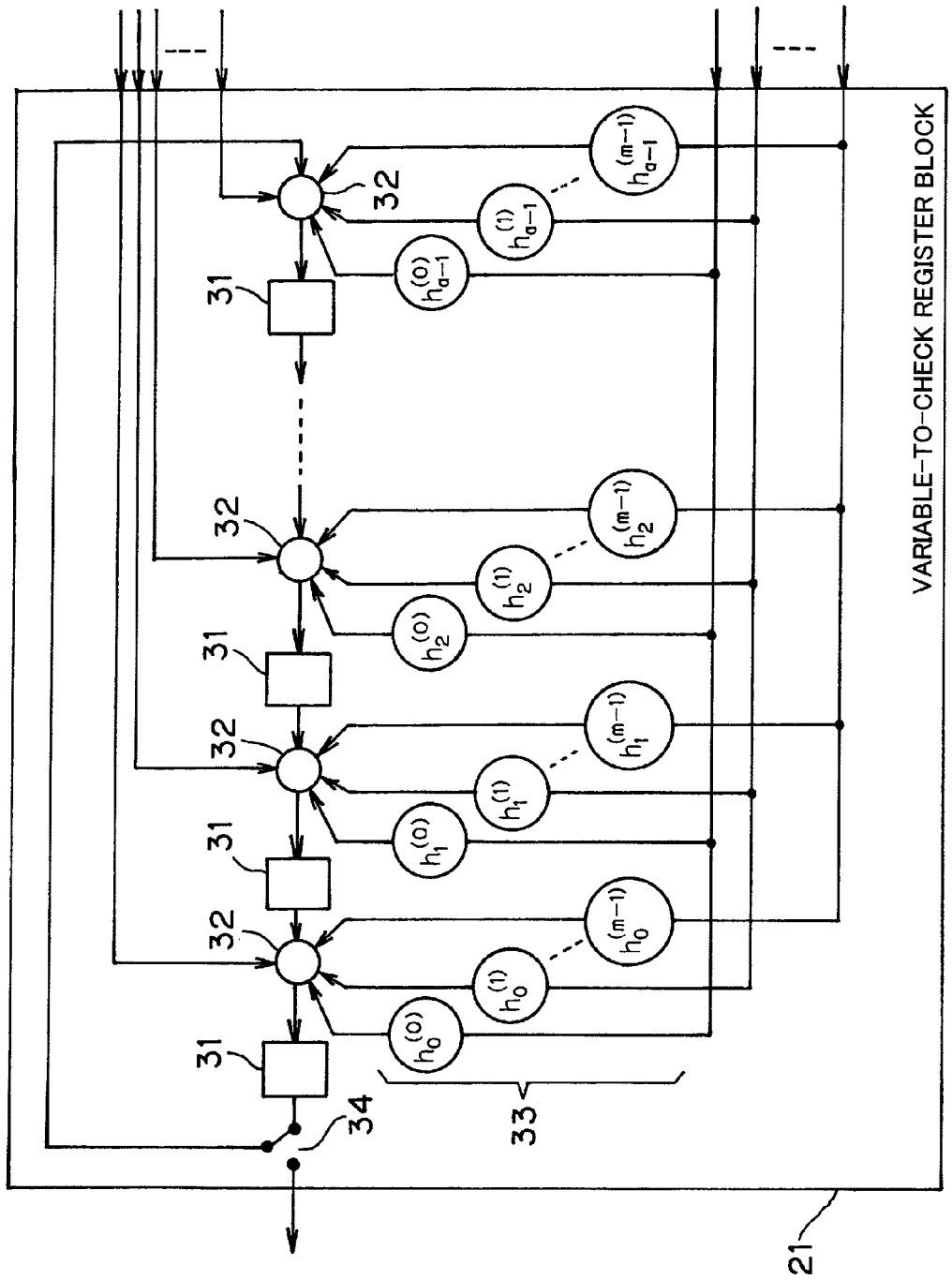
FIG. 3 is a block diagram showing an example of the configuration of a variable-to-check register block.

FIG. 3 is a block diagram showing an example of the configuration of the variable-check register block 21. The variable-check register block 21 includes the same number a of the registers 31 as the size of the cyclic matrix constituting the check matrix, and variable-to-check processing unit block (variable-to-check processing means) 32 arranged between the registers 31. The variable-variable-to-check register block 21 also includes connection switches 33 and an output switch 34. It is observed that the size of the cyclic matrix means the number of rows or the number of columns of the cyclic matrix. The cyclic matrix is a square matrix and hence its numbers of rows and columns are equal to each other.

The registers 31 are connected in series with one another via the variable-to-check processing unit blocks 32. The output switch 34 is connected to the last stage register 31. The output switch 34 is changed over so that the output of the last stage register 31 is fed back to the input of the initial stage register 31 and so that the output of the last stage register is supplied to the adder 23 after the end of a preset number of times of the feedback operations.

Meanwhile, the block of the registers in which the outputs of the registers are sequentially supplied to the downstream side registers and the output of the last stage register is fed back to the initial stage register is termed a feedback sift register.

Each variable-to-check register block 21 is supplied as input with m data sequences, with the number m being the same as the number of row blocks of the check matrix. When all data have been entered, the output switch 34 is changed over to sequentially output part of the data retained by the a registers 31.

The connection switches 33 determine whether or not the inputs to the variable-to-check register block 21 are to be supplied to the variable-to-check processing unit blocks 32 by m bit sequences $h_0^{(i)}, h_1^{(i)}, \ldots, h_{a-1}^{(i)}$, each composed of the a bits, where i denotes an integer from 0 to m−1. That is, the connection switches 33 determine whether or not the inputs to the variable-to-check register block 21 are to be supplied to the variable-to-check processing unit blocks 32 depending on whether or not an input end of the variable-to-check register block 21, not shown, is connected to each variable-to-check processing unit block 32.

In more detail, if $h_k^{(i)}$ is 1, k being an integer from 0 to a−1, the part denoted by $h_k^{(i)}$ in FIG. 3 is connected, whereas, if $h_k^{(i)}$ is 0, the part denoted by $h_k^{(i)}$ is unconnected. The variable-to-check register block 21 includes the same number of the variable-to-check processing unit blocks 32 as the number of the connections. The method of selecting these m bit sequences $h_0^{(i)}, h_1^{(i)}, \ldots, h_{a-1}^{(i)}$, each composed of the a bits, where i denotes an integer from 0 to m−1, will be described subsequently.

Figure 4:
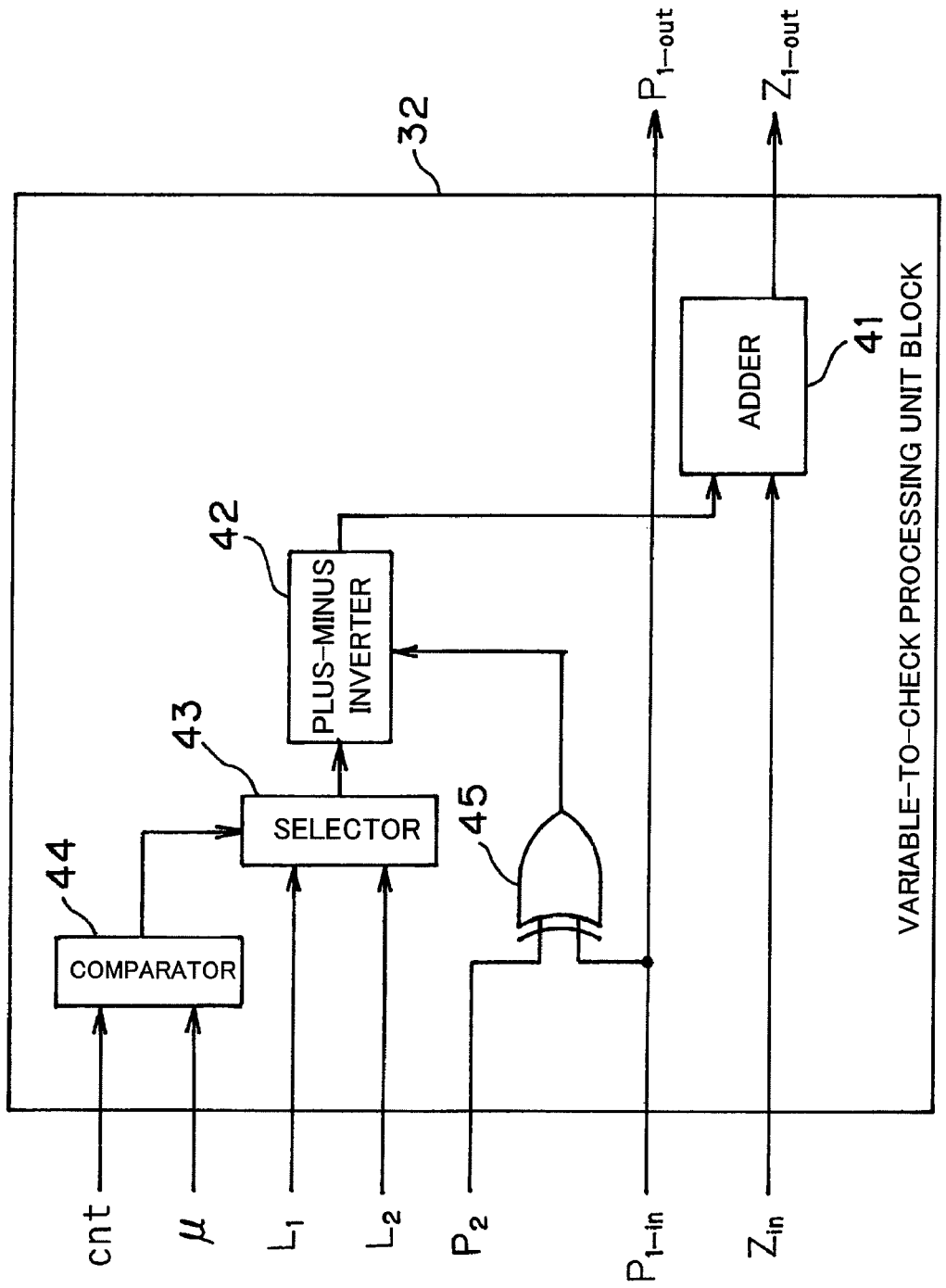
FIG. 4 is a block diagram showing an example of the configuration of a variable-to-check processing unit block.

FIG. 4 is a block diagram showing an example of the configuration of the variable-to-check processing unit block 32. The variable-to-check processing unit includes an adder 41, a comparator 44, a selector 43, a plus-minus inverter 42 and an XOR gate 45. The operation of the variable-to-check processing unit block 32 will be described subsequently.

Figure 5:
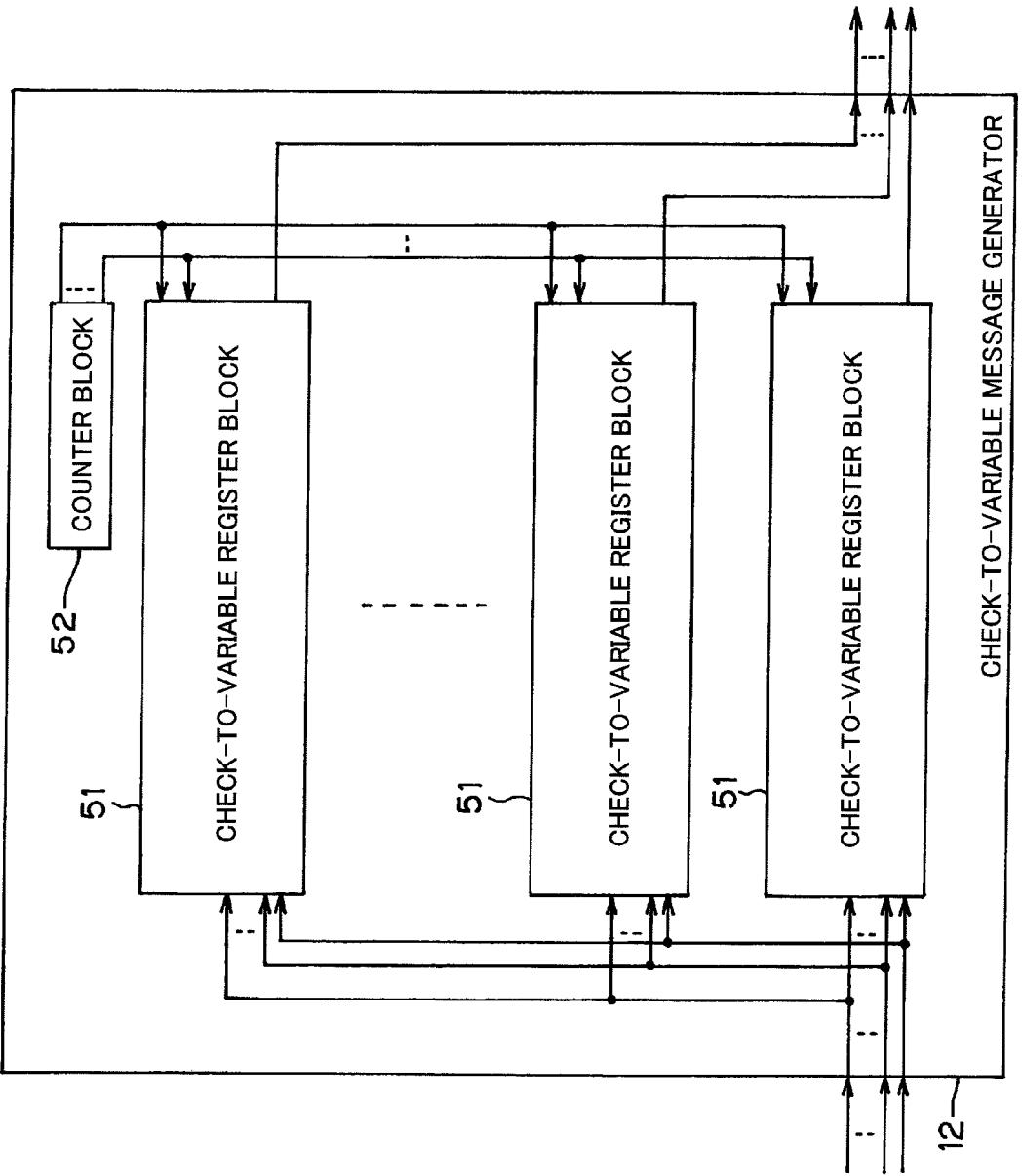
FIG. 5 is a block diagram showing an example of the configuration of a check-to-variable message generator.

FIG. 5 is a block diagram showing an example of the configuration of the check-to-variable message generator 12. This check-to-variable message generator 12 includes a number of check-to-variable register blocks 51, which is the same as the total number m of the row blocks of the check matrix, and a counter block (second clock counter) 52, which is a counter synchronized with the clock of the register 61 included in the check-to-variable register blocks 51.

An input of each check-to-variable register block 51 is an output of the variable-to-check message generator 11. That is, the output of each check-to-variable register block 21 of the variable-to-check message generator 11 is supplied via adder 23 to the variable-to-check message generator 11.

The number of the check-to-variable register blocks 51 is equal to the number m of the row blocks of the check matrix. The outputs of the variable-to-check message generator 11 are m sequences corresponding to the outputs of the check-to-variable register blocks 51.

Figure 6:
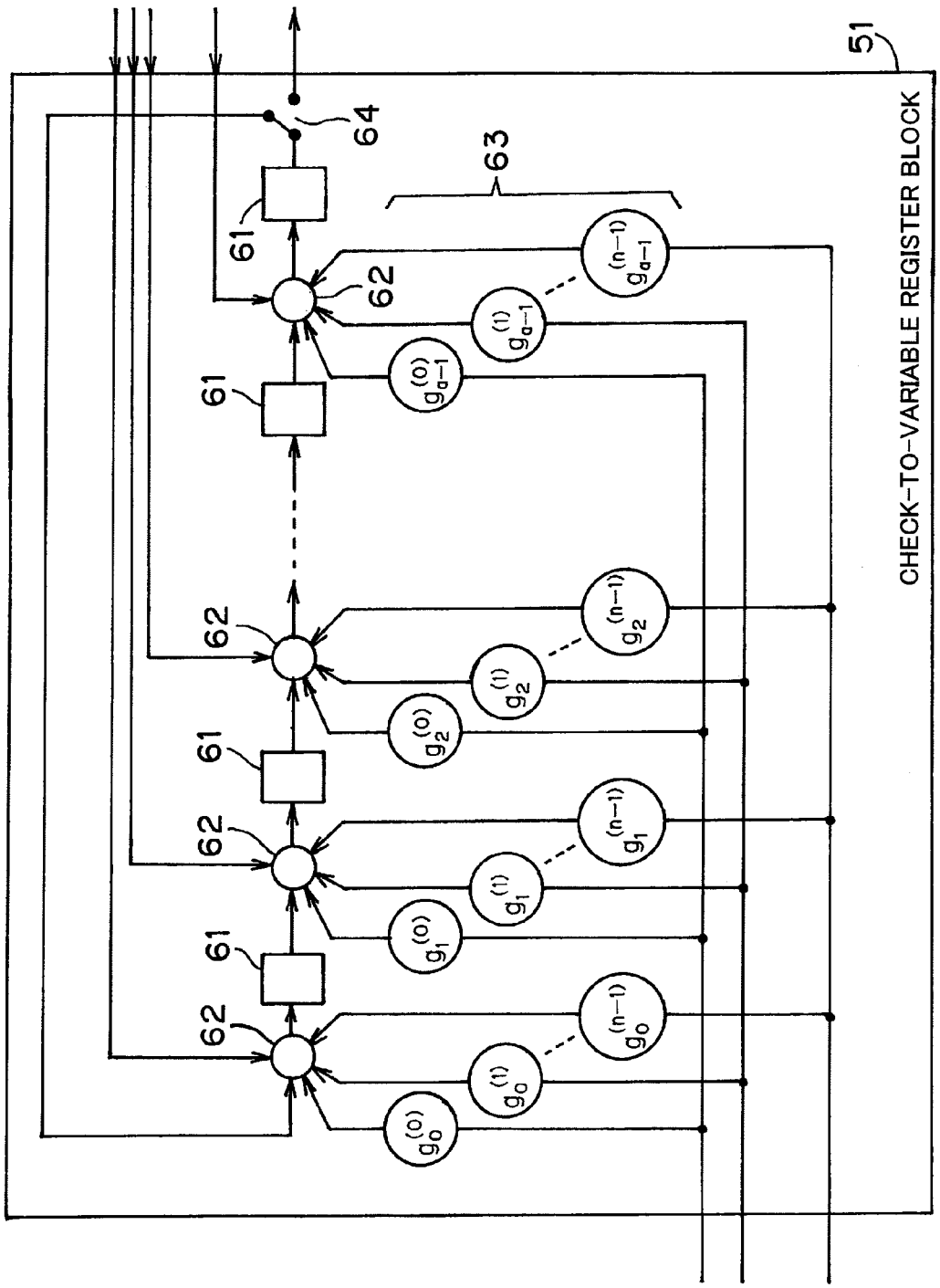
FIG. 6 is a block diagram showing an example of the configuration of a check-to-variable register block.

FIG. 6 is a block diagram showing an example of the configuration of the check-to-variable register blocks 51. This check-to-variable register blocks 51 includes a registers 61, a plurality of check-to-variable processing unit blocks (check-to-variable processing means) 62, a plurality of connection switches 63 and an output switch 64. The number a of the registers is equal to the size of the cyclic matrices making up the check matrix, and the check-to-variable processing unit blocks are arranged between the neighboring registers 61.

The registers 61 are connected in series with one another via the check—variable processing unit blocks 62. The output switch 64 is connected to the last stage register 61. The output switch 64 is changed over so that the output of the last stage register 61 is fed back to the input of the initial stage register 61 and so that the output of the last stage register is supplied to the normalization processing unit 13 after the end of a preset number of times of the feedback operations.

Each check-to-variable register block 51 is supplied with m sequences, with the number m being the same as the number of row blocks of the check matrix. When all data have been supplied, the output switch 64 is changed over to sequentially output part of the data retained by the a registers 61.

The connection switches 63 determine whether or not the inputs to the variable-to-check register block 51 are to be supplied to the check-to-variable processing unit blocks 62 by n bit sequences $g_0^{(j)}, g_1^{(j)}, \ldots, g_{a-1}^{(j)}$ each composed of the a bits, where j denotes an integer from 0 to n−1. That is, the connection switches 63 determine whether or not the inputs to the check-to-variable register block 51 are to be supplied to the check-to-variable processing unit blocks 62 depending on whether or not an input end of the check-to-variable register blocks 51, not shown, is to be connected to each check-to-variable processing unit block 62.

In more detail, if $g_k^{(j)}$ is 1, k being an integer from 0 to a−1, the part denoted by $g_k^{(j)}$ in FIG. 3 is connected, whereas, if is $g_k^{(j)}$ is 0, the part denoted by $g_k^{(j)}$ is unconnected. The check-to-variable processing unit block 62 includes the same number of the check-to-variable processing unit blocks as the number of the connections. The method of selecting these m bit sequences $g_0^{(j)}, g_1^{(j)}, \ldots, g_{a-1}^{(j)}$, each composed of the a bits, where j denotes an integer from 0 to n−1, will be described subsequently.

Figure 7:
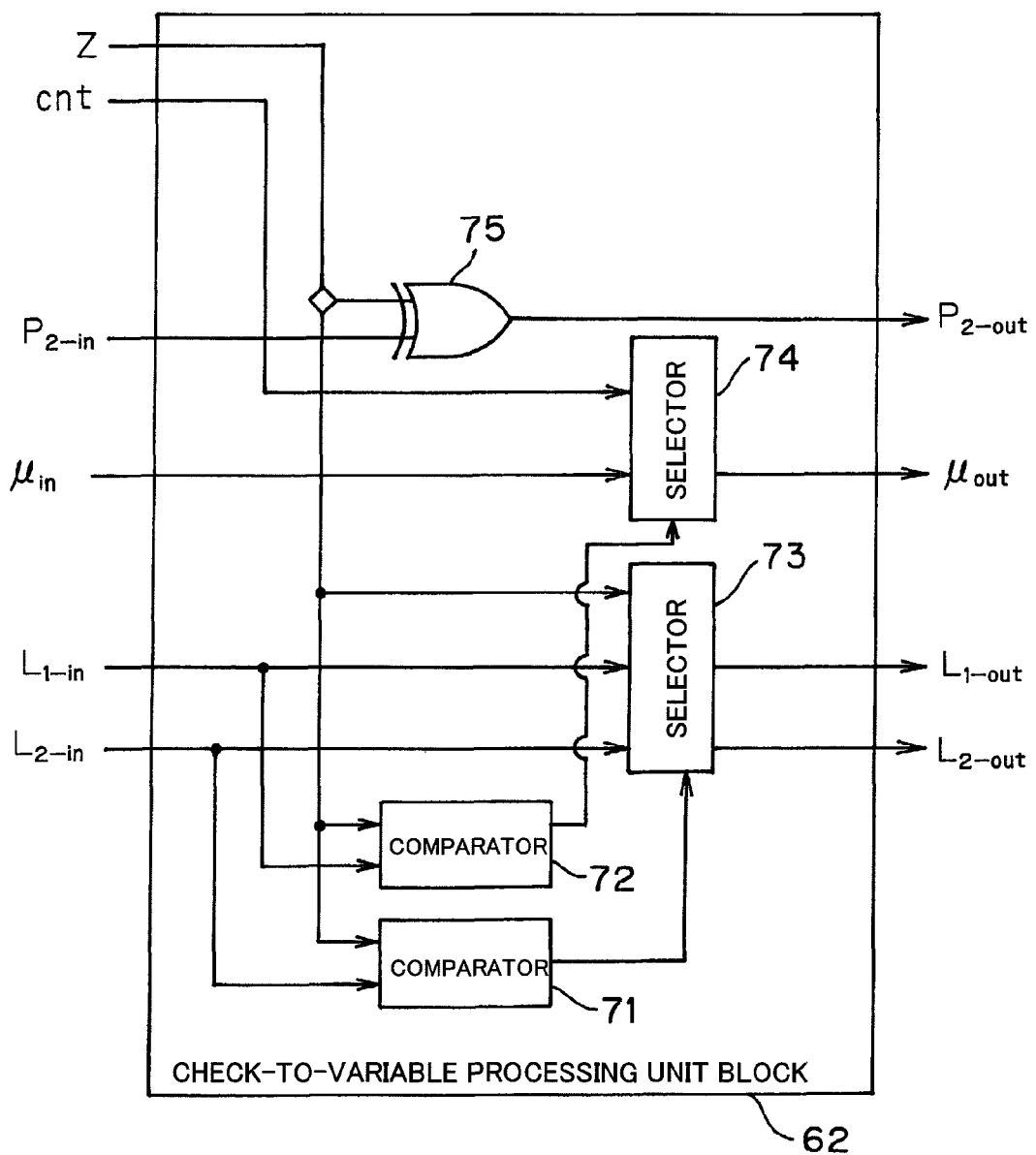
FIG. 7 is a block diagram showing an example of the configuration of a check-to-variable processing unit block.

FIG. 7 is a block diagram showing an example of the configuration of the check-to-variable processing unit block 62. The check-to-variable processing unit block 62 includes comparators 71, 72, selectors 73, 74 and an XOR gate 75. The operation of the check-to-variable processing unit block 62 will be described subsequently.

With the decoding apparatus of the present invention, an output of the variable-to-check message generator 11 is supplied to the check-to-variable message generator 12, and an output of the check-to-variable message generator 12 is supplied to the variable-to-check message generator 11. This sequence of operations is repeated a preset number of times, and a bit sequence, obtained on hard decision of the output of the variable-to-check message generator 11, is supplied as output of the decoding apparatus. 2xa clocks, a being the size of the cyclic matrix constituting the check matrix, are needed for each iterative processing. The decoding processing comes to a close with the number of clocks corresponding to the number of times of the iterative operations equal to 2xa.

The selection of the m a-bit sequences, which determines the connection of the variable-to-check register blocks 21, described above, is now described.

As mentioned above, the number of the variable-to-check register blocks 21 is the same as the total number n of the column blocks of the check matrix. The variable-to-check register blocks 21 correspond to the column blocks of the check matrix. As shown in the equations (1) and (2), the j'th column block, j being an integer from 0 to n−1, is made up of m axa cyclic matrices $H_{0,j}, H_{1,j}, \ldots, H_{m-1,j}$, with the row vectors of these cyclic matrices coinciding with cyclic shifting of $(f_0^{(0,j)}, f_1^{(0,j)}, \ldots, f_{a-1}^{(0,j)}), (f_0^{(1,j)}, f_1^{(1,j)}, \ldots, f_{a-1}^{(1,j)}), \ldots, (f_0^{(m-1,j)}, f_1^{(m-1,j)}, \ldots, f_{a-1}^{(m-1,j)})$, respectively. The m a-bit sequences $h_0^{(i)}, h_1^{(i)}, \ldots, h_{a-1}^{(i)}$, where i=0, 1, ..., m−1, may be determined, using the above row vectors, by the following equation (3):

[Equation 3]

$$h_k^{(i)} = f_k^{(i,j)}, k=0, 1, \cdots, a-1; i=0, 1, \cdots, m-1; \quad (3)$$

As described above, the connections in the n variable-to-check register blocks 21 depend on the column blocks of the check matrix the connections are associated with. In the following, the connections and the variable-to-check register blocks are distinguished from each other and the connections associated with the j'th column block of the check matrix, j being an integer from 0 to n−1, are denoted as $h_k^{(i,j)}$.

The information (data) retained and updated in the registers 31 in each variable-to-check register block 21 is now described. The information retained and updated in the registers 31 is made up of a message part and one other bit. The message part is data corresponding to a variable-to-check message (VC message) and the other one bit denotes the plus or minus sign of the data of the message part calculated by the variable-to-check processing unit block 32 in the directly previous iterative processing. These data will be described in detail subsequently.

The selection of the n a-bit sequences, determining the connections of the check-to-variable register block 51, described above, will now be described. The number of the check-to-variable register blocks 51 is equal to the total number m of the row blocks of the check matrix, with the check-to-variable register blocks 51 mating with the row blocks of the check matrix.

As shown in the equations (1) and (2), the i'th row block, where i denotes an integer from 0 to m−1, is made up of n axa cyclic matrices $H_{0,j}, H_{1,j}, \ldots, H_{m-1,j}$, with the row vectors of these cyclic matrices coinciding with cyclic shifting of $(f_0^{(i,0)}, f_1^{(i,0)}, \ldots, f_{a-1}^{(i,0)}), (f_0^{(i,1)}, f_1^{(i,1)}, \ldots, f_{a-1}^{(i,1)}), \ldots, (f_0^{(i,n-1)}, f_1^{(i,n-1)}, \ldots, f_{a-1}^{(i,n-1)})$, respectively. The n a-bit sequences $g_0^{(j)}, g_1^{(j)}, \ldots, g_{a-1}^{(j)}$, where j=0, 1, ..., m−1, may be determined, using the above row vectors, by the following equation (4):

[Equation 4]

$$g_k^{(j)} = f_{(k-1) \bmod a}^{(i,j)}, k=0, 1, \cdots, a-1; j=0, 1, \cdots, n-1; \quad (4)$$

As described above, the connections in the n check-to-variable register blocks 51 depend on the column blocks of the check matrix the connections are associated with. In the following, the connections and the variable-to-check register blocks are distinguished from each other and the connections associated with the i'th column block of the check matrix, i being an integer from 0 to m−1, are denoted as $g_k^{(i,j)}$.

The information (data) retained and updated in the registers 61 in each check-to-variable register block 51 is now described. The information retained and updated in the registers 61 is made up of a message part, the value of the clock counter, and one other bit. The message part is data corresponding to the check-to-variable message (CV message).

The other one bit, calculated by the variable-to-check message generator 11, is a syndrome for the result of hard decision, quantized in one bit, of the message calculated by the variable-to-check message generator 11 and entered to the check-to-variable message generator 12. In case these bit values are all zero, the result of hard decision of the message, calculated by the variable-to-check message generator 11, represents a codeword, and is an estimated transmission bit sequence output from the decoding apparatus. The above data will be described in detail subsequently.

The operation of the first exemplary embodiment of the present invention will now be described. Initially, the input and the output of the variable-to-check message generator 11, and the input and the output of the check-to-variable message generator 12 will be described. Output data of the check-to-variable message generator 12 is supplied to the variable-to-check message generator 11 via the normalization processing unit 13.

The output data of the check-to-variable message generator 12 are roughly classified into four sorts of data labeled $L_{t,1}^{(s)}, L_{t,2}^{(s)}, P_2(s,t)$ and $\mu(s,t)$, where s and t denote an integer from 0 to m−1 and an integer from 0 to a−1, respectively. $L_{t,1}^{(s)}$, $L_{t,2}^{(s)}$ are data equivalent to a check-to-variable message and $P_2(s,t)$ is one-bit data representing the product of the result of hard decision of input data of the check-to-variable message generator 12 (output data of the variable-to-check message generator 11), for example, the most significant bit, and the check matrix of the equation (1).

μ(s,t) is differently used depending on calculation accuracy. Concretely, should the highest calculation accuracy be required, μ(s,t) is data representing a set of two integers and, should lower calculation accuracy suffice, μ(s,t) is data representing a sole integer. Should still lower calculation accuracy suffice, the data μ(s,t) is not used. With decrease in calculation accuracy, the volume of data μ(s,t) becomes lesser, so that the dimension of the device is reduced.

The case of the maximum calculation accuracy, in which μ(s,t) denotes a set of two integers, is now described, and μ(s,t) will be described later.

The output data $L_{t,1}^{(s)}$, $L_{t,2}^{(s)}$, $P_2(s,t)$ and μ(s,t) from the check-to-variable message generator 12 are supplied to the normalization processing unit 13. As for $P_2(s,t)$ and μ(s,t), the normalization processing unit 13 outputs the same data as the input data and, as for $L_{t,1}^{(s)}$, $L_{t,2}^{(s)}$, it outputs the input data multiplied by a preset constant α, that is, $\alpha L_{t,1}^{(s)}$ and $\alpha L_{t,2}^{(s)}$.

Hence, the output data $L_{t,1}^{(s)}$, $L_{t,2}^{(s)}$, $P_2(s,t)$ and μ(s,t) from the check-to-variable message generator 12 are not directly supplied to the variable-to-check message generator, but $\alpha L_{t,1}^{(s)}$, $\alpha L_{t,2}^{(s)}$, $P_2(s,t)$ and μ(s,t) are supplied to the variable-to-check message generator 11.

In the description to follow, this notation with multiplication by a constant α is not used to prevent abuse of the symbols. That is, the input data to the variable-to-check message generator 11 is represented by $L_{t,1}^{(s)}$, $L_{t,2}^{(s)}$, $P_2(s,t)$ and μ(s,t) which stand for output data of the check-to-variable message generator 12.

The input data to the variable-to-check message generator 11 are an output of the check-to-variable message generator 12 and an output of the communication route $F_i$, where i denotes an integer from 0 to na−1.

The check-to-variable message generator 12 includes the same number of the check-to-variable register blocks 51 as the total number m of the row blocks of the check matrix (equation 1). An output at time point t of the s'th check-to-variable register blocks 51 becomes $L_{t,1}^{(s)}$, $L_{t,2}^{(s)}$, $P_2(s,t)$ and μ(s,t), where s denotes an integer from 0 to m−1 and t denotes an integer from 0 to a−1. These are data retained by the registers 61 in the check-to-variable register blocks 51 at the time of outputting.

The output of the variable-to-check message generator 11 becomes input data to the check-to-variable message generator 12. This input data is denoted as $Z_r^{(l)}$, where l denotes an integer from 0 to n−1 and r denotes an integer from 0 to a−1. The variable-to-check message generator 11 includes the same number of variable-to-check register blocks 21 as the total number n of the column blocks of the check matrix (equation 1). An r'th output of the l'th variable-to-check register block 21 becomes $Z_r^{(l)}$, where l denotes an integer from 0 to n−1 and r denotes an integer from 0 to a−1. $Z_r^{(l)}$ and the 1-bit data $P_1^{l,r}$ as later explained represent data retained by the registers 31 in the variable-to-check register block 21 at the time of outputting.

The operation of the variable-to-check message generator 11 is now described. To the variable-to-check message generator 11 are supplied $L_{t,1}^{(s)}$, $L_{t,2}^{(s)}$, $P_2(s,t)$, μ(s,t) and the output $F_i$ of the communication path, where i, s and t denote an integer from 0 to na−1, an integer from 0 to m−1 and an integer from 0 to a−1, respectively. The variable-to-check message generator 11 calculates $Z_r^{(l)}$, where l and r indicate an integer from 0 to n−1 and an integer from 0 to a−1, respectively, using the following equation (5):

[Equation 5]

$$Z_r^{(l)} = F_{la+r} + \sum_{j=0}^{a-1} \left( \sum_{\substack{i=0 \\ (l,r) \neq \mu(i,j)}}^{m-1} (-1)^{P_1(l,r) \oplus P_2(i,j)} h_{r+j}^{(i,l)} L_{j,1}^{(i)} + \sum_{\substack{i=0 \\ (l,r) = \mu(i,j)}}^{m-1} (-1)^{P_1(l,r) \oplus P_2(i,j)} h_{r+j}^{(i,l)} L_{j,2}^{(i)} \right) \quad (5)$$

In the above equation (5), the first and second terms represent a log likelihood ratio and an a-priori value, respectively, and each $P_1^{(l,r)}$ is 1-bit data stored from the outset in the registers 31 of the variable-to-check register block 21 in the variable-to-check message generator 11. The variable-to-check message generator 11 calculates the variable-to-check message data $Z_r^{(l)}$, where l and r indicate an integer from 0 to n−1 and an integer from 0 to a−1, respectively, and updates $P_1^{(l,r)}$, using the so calculated $Z_r^{(l)}$, in accordance with the following equation (6):

[Equation 6]

$$P_1(l,r) = \begin{cases} 1 & \text{when } Z_r^{(l)} > 0 \\ 0 & \text{when } Z_r^{(l)} \leq 0 \end{cases} \quad (6)$$

That is, $P_1^{(l,r)}$ is 1-bit data, corresponding to the most significant bit of $Z_r^{(l)}$. The sequence of these data (bit sequence) is output from the decoding apparatus as an estimated bit sequence for transmission.

The operation of the variable-to-check register block 21 is now described. The variable-to-check message generator 11 includes the same number of the variable-to-check register blocks 21 as the total number n of the column blocks of the check matrix (equation 1). Each variable-to-check register block 21 includes the same number a of the registers 31 as the size of the cyclic matrix constituting the check matrix.

The initial state (the value at time point 0) of message data retained in the r'th register 31 in the l'th variable-to-check register block 21 is denoted as $Z_r^{(l)}(a)$, and the message data at time point a-j is denoted as $Z_r^{(l)}(j)$, where l, r and j denote an integer from 0 to n−1, an integer from 0 to a−1 and an integer from 0 to a−1, respectively. With the initial state $Z_r^{(l)}(a)=0$, the message data at time point a-j may be calculated, from message data at time point a-j-1, in accordance with the following equation (7):

[Equation 7]

$$Z_r^{(l)}(j) = Z_{r+1}^{(l)}(j+1) + \sum_{\substack{i=0 \\ (l,r-j) \neq \mu(i,j)}}^{m-1} (-1)^{P_1(l,r+1)_{j+1} \oplus P_2(i,j)} h_r^{(i,l)} L_{j,1}^{(i)} + \sum_{\substack{i=0 \\ (l,r-j) = \mu(i,j)}}^{m-1} (-1)^{P_1(l,r+1)_{j+1} \oplus P_2(i,j)} h_r^{(i,l)} L_{j,2}^{(i)} \quad (7)$$

With the initial state (the value at time point 0) of $P_1{}^{(l,r)}{}_a = P_1{}^{(l,r)}$, the symbol $P_1{}^{(l,r)}{}_j$ is updated, at time point a−j, in accordance with the following equation (8):

[Equation 8]

$$P_1(l,r)_j = P_1(l,r)_{j+1} \qquad (8)$$

The data retained in the r'th register at time point a−j in the first variable-to-check register block 21 of the variable-to-check message generator 11 are $Z_r{}^{(l)}(j)$ and $P_1{}^{(l,r)}{}_j$. The device carrying out the processing of updating these data at each time point in accordance with the equations (7) and (8) is the variable-to-check processing unit block 32 shown in FIG. 4.

The variable-to-check processing unit block 32 is now described. The variable-to-check processing unit block 32 is supplied with cnt, μ, $L_1$, $L_2$, $P_2$, $P_{1-in}$ and $Z_{in}$, as inputs. Specifically, cnt and μ are supplied to the comparator 44. $L_1$, $L_2$ and an output of the comparator 44 are supplied to the selector 43. $P_2$ and $P_{1-in}$ are supplied to the XOR gate 45. An output of the selector 43 and an output of the XOR gate 45 are supplied to the plus-minus inverter 42. An output of the plus-minus inverter 42 and $Z_{in}$ are supplied to the adder 41.

Thus, the selector 43 selects $L_1$ or $L_2$, responsive to the result of comparison of cnt, which is the clock count value supplied to the comparator 44, and the integer between 0 and n−1, allocated to the register 31, and the so selected $L_1$ or $L_2$ is added by the adder 41 to $Z_{in}$.

That is, the value to be added to $Z_{in}$, is selected in dependence upon the clock count value and the integer from 0 to n−1 allocated to the register 31.

It is noted that μ, $L_1$, $L_2$ and $P_2$ correspond to $μ(i,j)$, $L_{j,1}{}^{(s)}$, $L_{j,2}{}^{(s)}$ and $P_2{}^{(i,j)}$ of the equation (7), respectively, and that cnt denotes a set of an integer 1 between 0 and n−1 preset from one variable-to-check register block 21 to another and an integer between 0 and (a−1) associated with a count value of the counter synchronized with the clock. On the other hand, the variable-to-check processing unit block 32 outputs, for the inputs $Z_{in}$ and $P_{1-in}$, $Z_{1-out}$ and $P_{1-out}$, shown in the equations (9) and (10), respectively:

[Equation 9]

$$Z_{1-out} = \begin{cases} Z_{1-in} + (-1)^{P_{1-in} \oplus P_2} L_1 & \text{when } cnt \neq \mu \\ Z_{1-in} + (-1)^{P_{1-in} \oplus P_2} L_2 & \text{when } cnt = \mu \end{cases} \qquad (9)$$

[Equation 10]

$$P_{1-out} = P_{1-in} \qquad (10)$$

The $Z_{1-out}$ and $P_{1-out}$ output are supplied via registers 31 as inputs $Z_{in}$ and $P_{1-in}$ to the next stage variable-to-check processing unit block 32, respectively.

The calculation processing shown by the equation (7) may be expressed by placing the same number of the variable-to-check processing unit blocks 32 as the number of 1's in the $\{h_r{}^{(0,l)}, h_r{}^{(1,l)}, h_r{}^{(2,l)}, \ldots, h_r{}^{(m-1,l)}\}$, between the r'th register 31 and the (r+1)th register 31 in the l'th variable-to-check register block 21. It is observed that l and r indicate an integer between 0 and n−1 and an integer between 0 and a−1, respectively.

By the calculations of the equations (7) and (8), the arithmetic sum of the message data $Z_r{}^{(l)}(0)$, retained in the r'th register 31 in the l'th variable-to-check register block 21 at time point a, and an output on the communication path $F_{la+r}$ is coincident with $Z_r{}^{(l)}$ in the equation (5), as shown by the following equation (11):

[Equation 11]

$$Z_r{}^{(l)} = F_{la+r} + Z_r{}^{(l)}(O) \qquad (11)$$

The data retained in the r'th register 31 in the l'th variable-to-check register block 21 of the variable-to-check message generator 11 at a time point all input data have been entered (time point a) are $Z_r{}^{(l)}(O)$ and $P_1{}^{(l,r)}{}_0$. $Z_r{}^{(l)}(O)$ then is summed, using the equation (11), so that data retained in the 0'th register 31 in each variable-to-check register block 21 is output to the check-to-variable message generator 12.

At the same time as the data is output, the data retained in the (j+1)st register 31 of the variable-to-check register block 21 is shifted to the j'th register 31, where j denotes an integer from 0 to a−2, so as to be sequentially output through the 0'th register 31. The variable-to-check register block 21 initializes the message part of the (a−1)st register 31, and enters the 1-bit data, derived by the equation (6) of the (a−1)st register 31, while entering the 1-bit data derived by the equation (6) from the output message data $Z_r{}^{(l)}$. The registers 31 are initialized at a time point all data have been output.

Thus, for the processing for variable-to-check message generation, a clocks are needed for each of the processing operations for inputting and the processing for outputting. These operations are termed the input processing mode and the output mode of the variable-to-check message generator 11, respectively.

By the above processing, the variable-to-check message $Z_r{}^{(l)}$ is calculated by the variable-to-check processing unit blocks 32 without using the RAM. The variable-to-check processing unit blocks 32 are each composed mainly of an adder 41 and is provided between neighboring registers 31.

The operation of the check-to-variable message generator 12 is now explained. An output of the check-to-variable message generator 12 is entered to the variable-to-check message generator 11 via the normalization processing unit 13. As mentioned above, these data are labeled $L_{t,1}{}^{(s)}$, $L_{t,2}{}^{(s)}$ and $P_2{}^{(i,j)}$ and $μ(i,j)$, where s and t denote an integer from 0 to m−1 and an integer from 0 to a−1, respectively.

The check-to-variable message generator 12 includes the same number of check-to-variable register blocks 51 as the total number m of the column blocks of the check matrix (equation 1). An (a−1−t)th output in the s'th variable-to-check register block 51 becomes $L_{t,1}{}^{(s)}$, $L_{t,2}{}^{(s)}$ and $P_2{}^{(i,j)}$ and $μ(i,j)$, where s and t denote an integer from 0 to m−1 and an integer from 0 to a−1, respectively. These become data stored in the registers 61 in the check-to-variable message generator 12 at the time of the outputting.

The check-to-variable message generator 12 receives the output $Z_r{}^{(l)}$ of the variable-to-check message generator 11, where l and r are an integer from 0 to n−1 and an integer from 0 to a−1, respectively, as mentioned above, and calculates $L_{t,1}{}^{(s)}$ and $L_{t,2}{}^{(s)}$ from the following equations (12) and (13).

[Equation 12]

$$L_{t,1}{}^{(s)} = \min W_t{}^{(s)} \qquad (12)$$

[Equation 13]

$$L_{t,2}{}^{(s)} = \min W_t{}^{(s)} \setminus \{L_{t,1}{}^{(s)}\} \qquad (13)$$

In the above equations, $W_t{}^{(s)}$ denotes a set shown by the following equation (14). That is, $L_{t,1}{}^{(s)}$ denotes the element with the smallest value among the elements of the set $W_t{}^{(s)}$ of the equation (14) and $L_{t,2}^{(s)}$ denotes the element with the second smallest value among the elements of the set $W_t^{(s)}$.

[Equation 14]

$$W_t^{(s)} = \{|Z_j^{(i)}| : f_{t+j}^{(s,i)} = 1, 0 \leq i < n, 0 \leq j < a\} \quad (14)$$

Meanwhile, $|Z_{j(i)}|$ denotes an absolute value of $Z_{j(i)}$. Also, $P_2(s,t)$ is calculated by the following equation (15):

[Equation 15]

$$P_2(s, t) = \sum_{j=0}^{a-1} \sum_{i=0}^{n-1} f_{t+j}^{(s,i)} P_1(i, j) \quad (15)$$

In the equation (15), each $P_1^{(i,j)}$ is 1-bit data representing the plus or minus of $Z_j^i$, as shown in the equation (6) above. In this manner, the output $Z_r^{(I)}$ of the variable-to-check message generator 11 is supplied to the check-to-variable message generator 12. However, the output is processed in the inside of the check-to-variable message generator 12 in a form split into one bit (most significant bit) representing the plus or minus sign of $Z_r^I$ and the other bit data representing an absolute value other than the sign.

On the other hand, in case the element with the smallest value, out of the elements of the set $W_t^{(s)}$ of the equation (14), is $|Z_\gamma^{(\lambda)}|$ that is, in case $L_{t,1}^{(s)} = |Z_\gamma^{(\lambda)}|$, $\mu(s,t)$ then satisfies the following equation (16):

[Equation 16]

$$\mu(s,t) = (\lambda, \gamma) \quad (16)$$

The operation of the check-to-variable register block 51 is now explained. The check-to-variable message generator 12 includes the same number of the check-to-variable register blocks 51 as the total number m of the row blocks of the check matrix shown in the equation (1), while each check-to-variable register block 51 includes the same number a of the registers 61 as the size of the cyclic matrix constituting the check matrix.

The initial state (value at time point 0) of the message data part, stored in the t'th register 61 in the s-th check-to-variable register block 51, is denoted as $L_{t,1}^{(s)}(0)$, $L_{t,2}^{(s)}(0)$, and the initial state of data equivalent to the 1-bit information $P_2(s,t)$ is denoted as $P_2(s,t)_0$. Each data at time point j is denoted as $L_{t,1}^{(s)}(j)$, $L_{t,2}^{(s)}(j)$, $P_2(s,t)$, respectively, where s, t and j denote an integer from 0 to m−1, an integer from 0 to a−1 and an integer from 1 to a, respectively.

If it is assumed that $L_{t,1}^{(s)}(0)$ and $L_{t,2}^{(s)}(0)$, as the initial states, are the largest numbers that may be represented by the register 61, and that $P_2(s,t)=0$, each data at time point j may be calculated, from each data at time point j−1, in accordance with the following equations (17), (18) and (19):

[Equation 17]

$$L_{t,1}^{(s)}(j) = \min W_{t-1}^{(s)}(j-1) \quad (17)$$

[Equation 18]

$$L_{t,2}^{(s)}(j) = \min W_{t-1}^{(s)}(j-1) \setminus \{L_{t,1}^{(s)}(j)\} \quad (18)$$

[Equation 19]

$$P_2(s, t)_j = P_2(s, t-1)_{j-1} + \sum_{i=0}^{n-1} g_t^{(s,i)} P_1(i, j-1) \quad (19)$$

In the above equations (17) and (18), $W_{t-1}^{(s)}(j-1)$ denotes the set indicated by the following equation (20):

[Equation 20]

$$W_{t-1}^{(s)}(j-1) = \{|Z_{j-1}^{(i)}| : g_t^{(s,i)} = 1, 0 \leq i < n\} \quad (20)$$
$$\bigcup \{L_{t-1,1}^{(s)}(j-1), L_{t-1,2}^{(s)}(j-1)\}$$

That is, $L_{t,1}^{(s)}(j)$ in the equation (17) is an element with the smallest value, among the elements of $W_{t-1}^{(s)}(j-1)$, while $L_{t,2}^{(s)}(j)$ in the equation (18) is an element with the second smallest value among the elements of $W_{t-1}^{(s)}(j-1)$. That is, out of the elements of $W_{t-1}^{(s)}(j-1)$, the elements with the smallest value and with the second smallest value are selected and retained in the next stage register 61.

Similar processing is carried out for $\mu(s,t)$ of the equation (16). That is, with the initial state $\mu(s,t)0$ at time point 0, data $\mu(s,t)_j$ at time point j may be calculated in accordance with the following equation (21):

[Equation 21]

$$\mu(s, t)_j = \begin{cases} (i, j-1) & \text{when } L_{t,1}^{(s)}(j) = |Z_{j-1}^{(i)}| < L_{t-1,1}^{(s)}(j-1) \\ \mu(s, t-1)_{j-1} & \text{when } L_{t,1}^{(s)}(j) = L_{t-1,1}^{(s)}(j-1) \end{cases} \quad (21)$$

In the s'th check-to-variable register block 51 of the check-to-variable message generator 12, the data retained by the t'th register 61 at time point j are $L_{t,1}^{(s)}(j)$, $L_{t,2}^{(s)}(j)$, $P_2(s,t)_j$ and $\mu(s,t)_j$. The block in which the processing of updating these data at each time point in accordance with the equations (17) to (21) is the check-to-variable processing unit block 62.

The check-to-variable processing unit block 62 is now explained. The check-to-variable processing unit block 62 receives Z, cnt, $P_{2\text{-}in}$, $\mu_{in}$, $L_{1\text{-}in}$ and $L_{2\text{-}in}$ as inputs.

Specifically, an XOR gate 75 receives the information indicating the plus and minus of $P_{2\text{-}in}$ and that indicating the plus and minus of Z (most significant bit of Z). The comparator 71 receives $L_{2\text{-}in}$ and the absolute value of Z (bits other than the most significant bit of Z). The comparator 72 receives $L_{1\text{-}in}$ and the absolute value of Z. The absolute value of Z, $L_{1\text{-}in}$, $L_{2\text{-}in}$ and an output of the comparator 71 are supplied as inputs to the selector 73, which then changes over its output responsive to the output results of the comparator 71. The selector 74 receives cnt, $\mu_{in}$ and the output of the comparator 72, as inputs, and changes over its outputs responsive to the output results of the comparator 72.

In FIG. 7, the fact of dividing Z into the most significant bit (information indicating the plus or minus of Z) and bits other than the most significant bit (absolute value of Z) is indicated by an open lozenge. The most significant bit of Z is supplied to the XOR gate 75, whilst the bits other than the most significant bit of Z are supplied to the comparators 71, 72 and to the selector 73.

Z is equivalent to $Z_{j-1}^{(i)}$ of the equation 20, whilst cnt indicates a set of an integer from 0 to n−1 and an integer from 0 to a−1 corresponding to the count value synchronized with the clocks. The check-to-variable processing unit block 62 outputs, for the inputs $L_{1\text{-}in}$, $L_{2\text{-}in}$, $P_{2\text{-}in}$ and $\mu_{in}$, $L_{1\text{-}out}$, $L_{2\text{-}out}$, $P_{2\text{-}out}$ and $\mu_{out}$, represented by the following equations (22), (23), (24) and (25), respectively:

[Equation 22]

$$L_{1\text{-}out} = \begin{cases} |Z| & \text{when } |Z| < L_{1\text{-}in} \\ L_{1\text{-}in} & \text{when } |Z| \geq L_{1\text{-}in} \end{cases} \quad (22)$$

[Equation 23]

$$L_{2\text{-}out} = \begin{cases} L_{1\text{-}in} & \text{when } |Z| < L_{1\text{-}in} \\ |Z| & \text{when } L_{1\text{-}in} \leq |Z| < L_{2\text{-}in} \\ L_{2\text{-}in} & \text{when } L_{2\text{-}in} \leq |Z| \end{cases} \quad (23)$$

[Equation 24]

$$P_{2\text{-}out} = \begin{cases} P_{2\text{-}in} \oplus 1 & \text{when } |Z| > 0 \\ P_{2\text{-}in} & \text{when } Z \leq 0 \end{cases} \quad (24)$$

[Equation 25]

$$\mu_{out} = \begin{cases} cnt & \text{when } |Z| < L_{1\text{-}in} \\ \mu_{in} & \text{when } |Z| \geq L_{1\text{-}in} \end{cases} \quad (25)$$

That is, the check-to-variable processing unit block 62 outputs the smallest value, out of the values of Z calculated so far, as $L_{1\text{-}out}$ via the register 61 to the next stage check-to-variable processing unit block 62. When the value of $L_{1\text{-}out}$ of the directly previous stage, entered as $L_{1\text{-}in}$, has become smallest, as shown in the equation (25), the next stage check-to-variable processing unit block 62 outputs, as $\mu_{out}$, a set of an integer from 0 to n−1 as cont and an integer between 0 and a−1 corresponding to the count value synchronized with the clock.

The calculation processing shown by the equations (17) to (21) may be expressed by placing the same number of the check-to-variable processing unit blocks 62 as the number of 1's in the $\{gt^{(s,0)}, gt^{(s,1)}, gt^{(s,2)}, \ldots, gt^{(s,n-1)}\}$ between the t'th register 61 and the (t+1)th register 61 in the s'th check-to-variable register block 51. It is observed that s and t denote an integer between 0 and m−1 and an integer between 0 and a−1, respectively.

By the calculations of the equations (17) to (21), the data $L_{t,1}{}^{(s)}(a)$, $L_{t,2}{}^{(s)}(a)$, $P_2(s,t)_a$ and $\mu(s,t)_a$, retained at time point a in a t'th register 61 of the s'th check-to-variable register block 51, are coincident with $L_{t,1}{}^{(s)}$ in the equation (12), $L_{t,2}{}^{(s)}$ in the equation (13), $P_2(s,t)$ in the equation 15 and $\mu(s,t)$ in the equation 16, as indicated by the following equations (26) to (29):

[Equation 26]

$$L_{t,1}{}^{(s)} = L_{t,1}{}^{(s)}(a) \quad (26)$$

[Equation 27]

$$L_{t,2}{}^{(s)} = L_{t,2}{}^{(s)}(a) \quad (27)$$

[Equation 28]

$$P_2(s,t) = P_2(s,t)_a \quad (28)$$

[Equation 29]

$$\mu(s,t) = \mu(s,t)_a \quad (29)$$

At a time point all input data have been received (time point a), the data retained in the t'th register 61 in the s'th check-to-variable register block 51 of the check-to-variable message generator 12 are $L_{t,1}{}^{(s)}(a)$, $L_{t,2}{}^{(s)}(a)$, $P_2(s,t)_a$ and $\mu(s,t)_a$. These data are output from the (a−1)st register 61 of each check-to-variable register block 51 to the variable-to-check message generator 11. At the same time as those data are output, the check-to-variable message generator 12 shifts data retained in the j'th register 61 to the (j+1)st register 61, where j denotes an integer from 0 to a−2, to sequentially output the data through the (a−1)st register 61.

By initializing the 0'th register 61, the respective registers are initialized at a time point when all outputs have been completed. Thus, for the processing for check-to-variable message generation, a clocks are needed for processing operations for inputting and accompanied processing thereof and for outputting. These operations are termed the input processing mode and the output mode of the variable-to-check message generator 11, respectively. Thus, by the blocks shown in FIGS. 5 to 7, the processing of check-to-variable message generation may be implemented without using the RAMs, by the shift registers and the check-to-variable processing unit blocks 62, which are each formed mainly of adders and which are provided between the neighboring shift registers.

Meanwhile, the variable-to-check message generator 11, check-to-variable message generator 12 and the normalization processing unit 13 are each implemented by a semiconductor device, such as an IC (Integrated Circuit). Hence, each block of the variable-to-check message generator 11 or each block of the check-to-variable message generator 12 is implemented by a semiconductor device, such as an IC.

Figure 8:
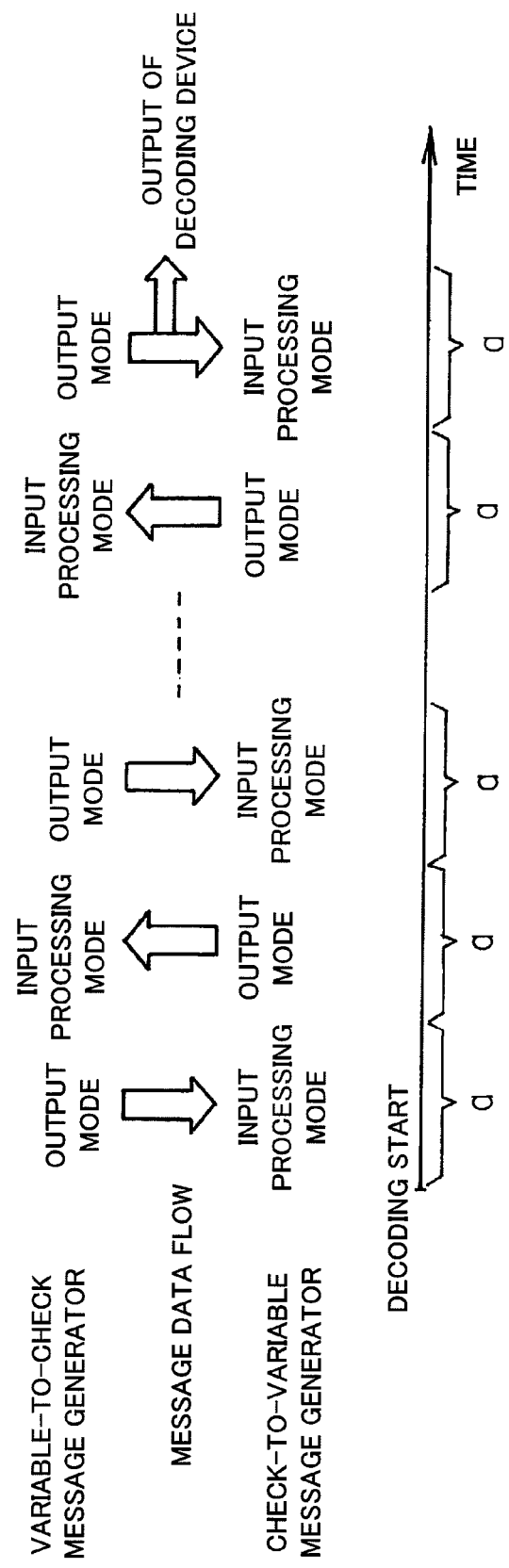
FIG. 8 is a schematic view showing the operation of the decoding apparatus as a whole.

The operation of the decoding apparatus in its entirety of the present invention, shown in FIG. 1, is now explained. FIG. 8 depicts a schematic view showing the operation of the decoding apparatus in its entirety.

The processing by the decoding apparatus is commenced with the variable-to-check message generator 11 in the output mode and with the check-to-variable message generator 12 in the input processing mode.

In commencing the decoding, the data retained by the registers 31 in the variable-to-check register blocks 21 are all initialized to 0. The data retained in the registers 61 of the check-to-variable register block 51 are also initialized.

Since all data retained by the registers 31 of the variable-to-check register blocks 21 have been initialized to 0, on startup, the message data supplied as output by the variable-to-check message generator 11 to the check-to-variable message generator 12 during the time since startup until a clocks have elapsed, are coincident with the received data $F_{la+r}$, where l and r indicate an integer from 0 to n−1 and an integer from 0 to a−1, respectively.

When a clocks have elapsed, the outputting of the message data by the variable-to-check message generator 11 to the check-to-variable message generator 12 comes to a close. At this time point, the 1-bit representing the plus or minus of $F_{la+r}$ has been set (retained) by the register 31 in the variable-to-check register block 21, as mentioned above, while data to be next output to the check-to-variable message generator 12 is retained by the registers 61 in the check-to-variable register block 51.

The input processing mode and the output mode are then changed over every a clocks, as shown in FIG. 8. That is, the outputting of the message data to the variable-to-check message generator 11 by the check-to-variable message generator 12 and the outputting of the message data from the variable-to-check message generator 11 to the check-to-variable message generator 12 are carried out alternately.

In the respective modes, the check-to-variable message generator 12 and the variable-to-check message generator 11 reiterate the above processing a preset number of times. Finally, the variable-to-check message generator 11 is set to the output mode, while the check-to-variable message generator 12 is set to the input processing mode. The variable-to-check message generator 11 sequentially outputs one bit, representing the plus or minus of output data, as an output of the decoding apparatus.

Meanwhile, the data $P_2(s,t)$, processed by the check-to-variable message generator 12, may be used as data for deciding whether or not, as a result of the above decoding processing, the errors contained in the received data have been corrected.

With the present exemplary embodiment, described above, the processing of calculating the variable-to-check message and the estimated transmission bits may be carried out by a plural number of the registers 31 and the variable-to-check processing unit blocks 32, without using the RAM. The variable-to-check processing unit blocks are each made up mainly of an adder and provided between neighboring registers 31.

Additionally, with the present exemplary embodiment, the processing of calculating the check-to-variable message may be carried out by the registers 61 and the check-to-variable processing unit blocks 62, without using the RAM. The check-to-variable processing unit blocks are each composed mainly of a comparator and arranged between neighboring registers 61.

The decoding apparatus reiterates the above processing to decode the input sequence of received data to output the estimated bit sequence for transmission. It is thus possible with the decoding apparatus of a simplified configuration not employing the RAM to decode the input sequence of received data at a high speed to output an estimated transmission bit sequence without limitations imposed by the RAM access speed.

Moreover, with the present exemplary embodiment, the data $P_2(s,t)$, processed by the check-to-variable message generator 12, may be used as data for deciding whether or not an error contained in the received data is correctable.

Figure 9:
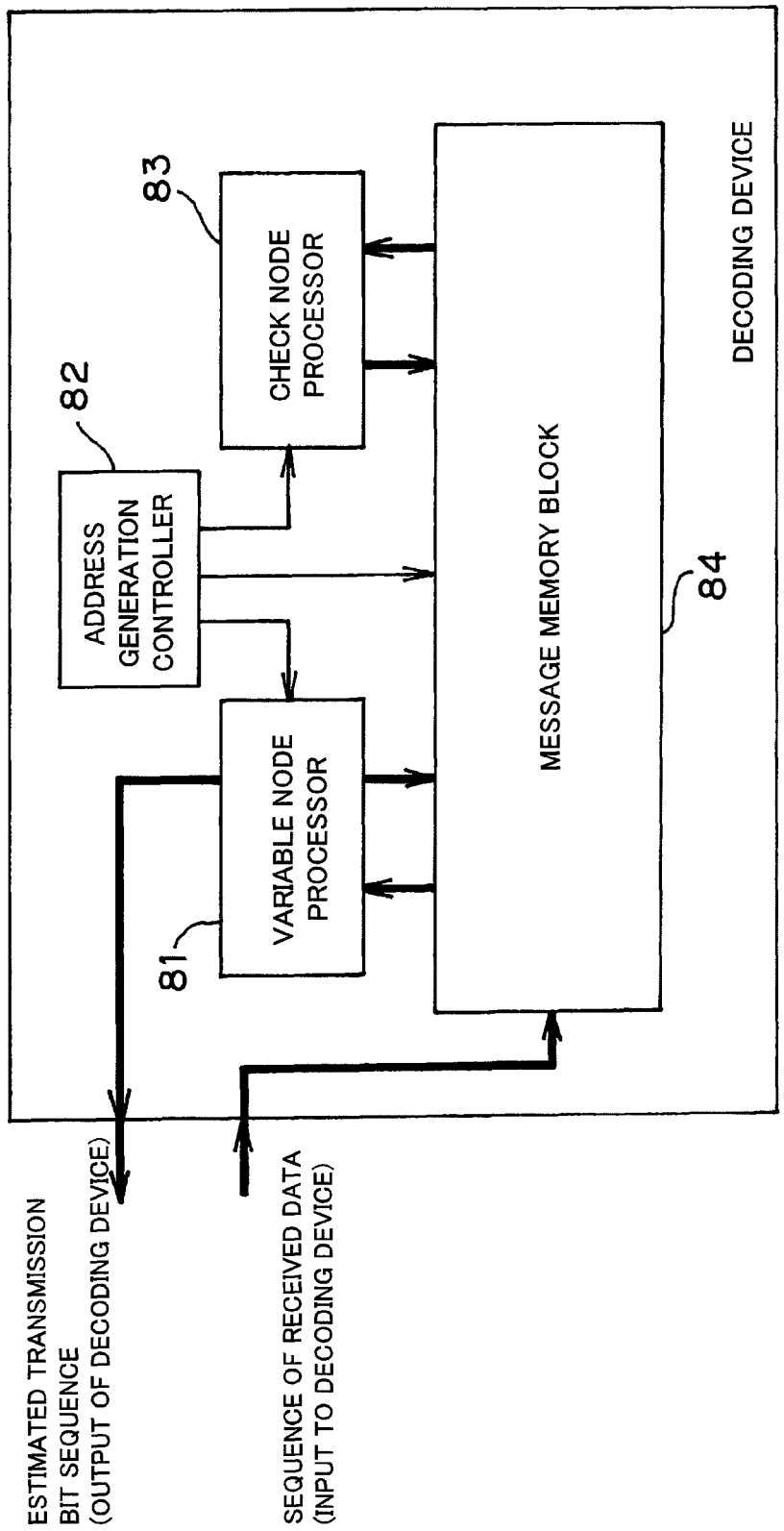
FIG. 9 is a block diagram showing an example of the configuration of a decoding apparatus for low density parity check codes employing a RAM.

An example of the configuration of a decoding apparatus for low density parity check codes, employing the RAM as a memory device, is now described with reference to the drawings. FIG. 9 is a block diagram showing an example of the configuration of a decoding apparatus for low density parity check codes employing the RAM. This decoding apparatus includes a RAM, not shown, a message memory block 84, an address generation controller 82 and a check node processor 83. The RAM is a memory device for holding received data as a target of error correction. The message memory block is implemented by a RAM as a memory device for holding data generated in the course of the decoding and which is termed a message. The address generation controller generates and controls the RAM addresses, and the check node processor is used to update the message.

The message is roughly divided into a variable-to-check message and a check-to-variable message. Both of these two messages may be subdivided further. In case the number of rows and that of columns in the check matrix H are M and N, respectively, with M and N each being a positive integer, the variable-to-check message is classified into $Z_{i,j}$, while the check-to-variable message is classified into $L_{i,j}$.

The suffices i and j denote an integer from 0 to M−1 and an integer from 0 to N−1, respectively. It is observed that i represents components of row vectors or column vectors of the check matrix and j represents components of column vectors or row columns of the check matrix. The variable node processor 81 updates the variable-to-check message from the check-to-variable message and the received data. The details of the variable node processing may be represented by the following equation (30):

[Equation 30]

$$Z_{i,j} = F_j + \sum_{i'} L_{i',j} \qquad (30)$$

In the above equation, j is an integer from 0 to N−1, i denotes an integer from 0 to M−1, Fj denotes corresponding received data and i' is an integer 0 to M−1 not coincident with i and covers all integers the elements of which in the row vector of the check matrix corresponding to j are 1. The check node processor 83 updates the check-to-variable message from the variable-to-check message. The details of the check node processing are represented by the following equation (31):

[Equation 31]

$$L_{i,j} = (-1)^{P_{i,j}} \min_{j'} |Z_{i,j'}| \qquad (31)$$

In the above equation, j denotes an integer from 0 to N−1, i denotes an integer from 0 to M−1, Pi,j denotes 0 or 1 and j' denotes integers from 0 to N−1 not coincident with j and covers all integers the elements of which in the row vector of the check matrix corresponding to i are 1.

If, in case of low density parity check codes the check matrix of which is a block of the cyclic matrix (pseudo cyclic low density parity check code), the orderliness of the check matrix is exploited, the sum part of the equation (30) and the index of the smallest value computing part of the equation (31) may be patterned to simplify address generation for RAM accessing.

Second Exemplary Embodiment

The second exemplary embodiment of the present invention is now described. Initially, the role of μ(s,t), where s and t denote an integer from 0 to m−1 and an integer from 0 to a−1, respectively, as one of the four sorts of data calculated by the check-to-variable message generator 12, described above in connection with the first exemplary embodiment, is described.

The data μ(s,t) is a set of two integers, that is, an integer from 0 to n−1 and an integer from 0 to a−1, and is needed for deciding on which of two data $L_{t,1}^{(s)}$ and $L_{t,2}^{(s)}$, output by the check-to-variable message generator 12, is to be summed in the processing of the equation (7) carried out by the check-to-variable message generator 12.

As mentioned above, $L_{t,1}^{(s)}$ and $L_{t,2}^{(s)}$ denote the elements of the set $W_t^{(s)}$ of the equation (14) having the smallest value and the second smallest value, respectively. If the processing by the variable-to-check message generator 11, shown by the equation (7), is replaced by the following equation (32), the value calculated by this operation, though dependent on selection of the check matrices (equation 1 and equation 2), approximates fairly well the value calculated by the equation (7).

[Equation 32]

$$Z_r^{(l)'} = F_{la+r} + \sum_{j=0}^{a-1} \sum_{i=0}^{m-1} (-1)^{P_1(L,r) \oplus P_2(i,j)} h_{r+j}^{(i,l)} L_{j,2}^{(i)} \qquad (32)$$

That is, since it is not both the element with the smallest value and the element with the second smallest value, out of the elements of the set $W_t^{(s)}$ in the equation (14), but only the element with the second smallest value, that is used, it is unnecessary to calculate μ(s,t) by the check-to-variable message generator 12.

It is thus possible to reduce the bit widths of the registers 61 in the check-to-variable register block 51 or to simplify the configurations of the check-to-variable processing unit blocks 62 or the variable-to-check processing unit block 32, thereby reducing the size of the entire device and simplifying the processing.

Figure 10:
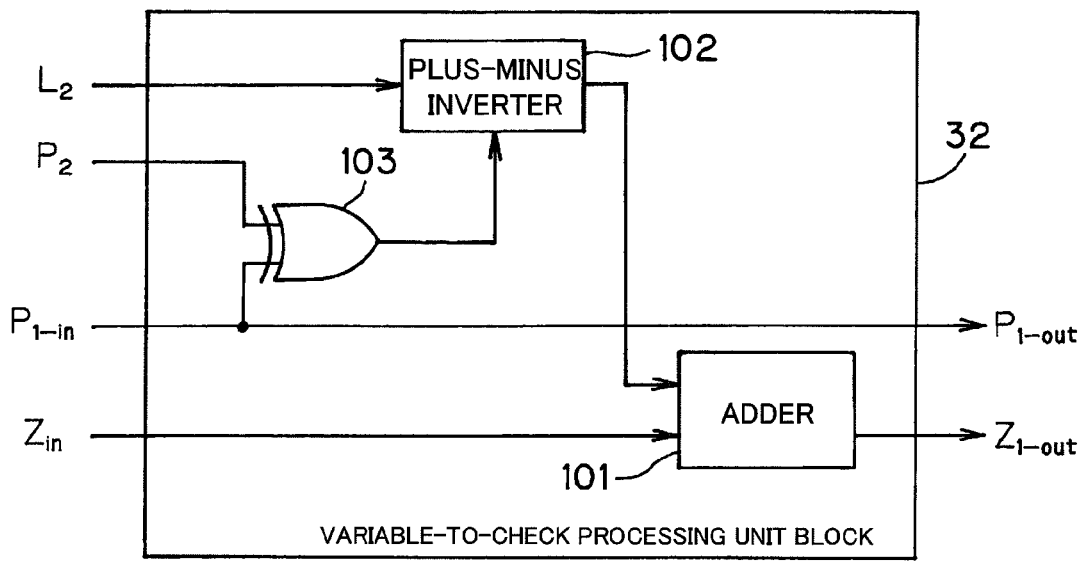
FIG. 10 is a block diagram showing an example of the configuration of a simplified variable check processing unit block.

FIG. 10 is a block diagram showing an example of the configuration of the simplified variable-to-check processing unit block 32.

Referring to FIG. 10, the simplified variable-to-check processing unit block 32 includes a plus-minus inverter 102, an adder 101 and an XOR gate 103. The XOR gate 103 is supplied with $P_2$ and $P_{1-in}$. The plus-minus inverter 102 is supplied with L2 and an output of the XOR gate 103. The adder 101 is supplied with $Z_{in}$ and with an output of the plus-minus inverter 102. It is noted that, since the input/output data, shown in FIG. 10, are equivalent to data indicated by the same symbols, such as $P_{1-in}$, the description is dispensed with.

Since the simplified variable-to-check processing unit block 32 is not in need of the input μ or $L_1$, its configuration is simplified compared to the variable-to-check processing unit block 32 of the first exemplary embodiment, shown in FIG. 4, thus enabling the bit widths of the registers 31 in the corresponding variable-to-check register block 21 to be reduced.

Figure 11:
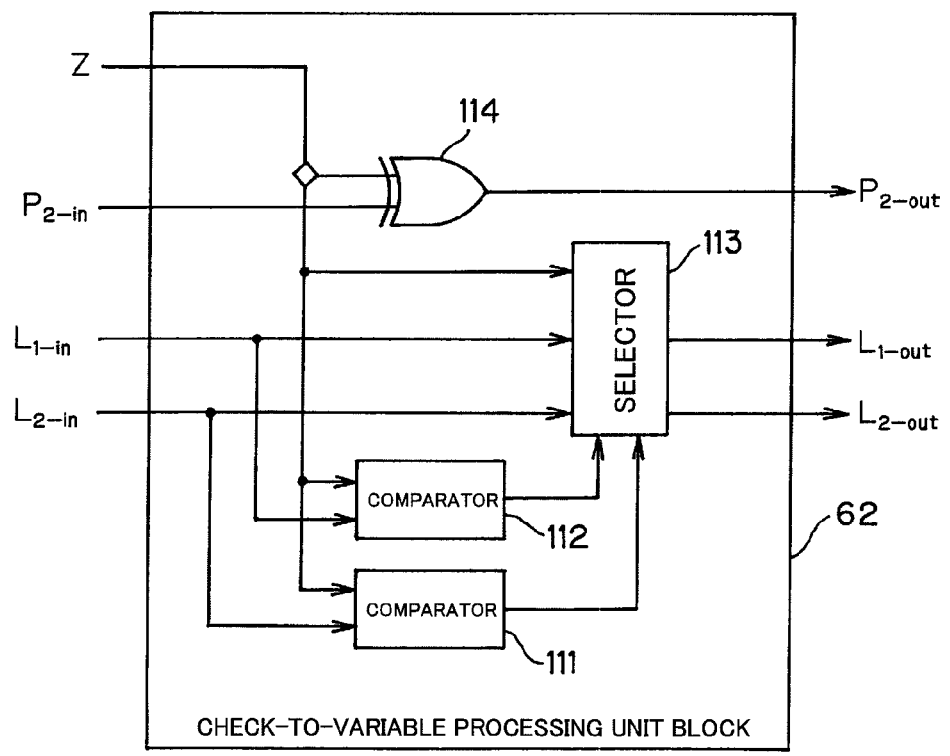
FIG. 11 is a block diagram showing an example of the configuration of a simplified check variable processing unit block.

FIG. 11 is a block diagram showing an example of the configuration of a simplified check-to-variable processing unit block 62.

Referring to FIG. 11, the simplified check-to-variable processing unit block 62 includes a selector 113 and comparators 111 and 112. An XOR gate 114 receives the information indicating the plus or minus of Z (most significant bit of Z) and $P_{2-in}$. The comparator 111 is supplied with the absolute value of Z (bits other than the most significant bit of Z). The comparator 112 is supplied with the absolute value of Z and with $L_{2-in}$. The selector 113 is supplied with the absolute value of Z, $L_{1-in}$ and $L_{2-in}$, an output of the comparator 111, and with an output of the comparator 112.

In FIG. 11, the fact of dividing Z into the most significant bit (information indicating the plus or minus of Z) and bits other than the most significant bit (absolute value of Z) is indicated by an open lozenge. The most significant bit of Z is supplied to the XOR gate 75, whilst the bits other than the most significant bit of Z are supplied to the comparators 111, 112 and to the selector 113.

It is observed that the input/output data, shown in FIG. 11, are equivalent to data represented by the same symbols, such as $P_{2-in}$ and hence the description on those input data is omitted for brevity.

As described above, the simplified check-to-variable processing unit block 62 is not in need of an input μ, and hence is simpler in configuration than the check-to-variable processing unit block 62 of the first exemplary embodiment shown in FIG. 7. It is possible to reduce the bit width of the register 61 in the check-to-variable register block 51.

It is possible with the present exemplary embodiment, described above, to reduce the number of the registers 61 in the check-to-variable register block 51, thus reducing the size of the entire decoding apparatus and simplifying the processing.

Meanwhile, in case the calculations are performed in accordance with the following equation (33), message data may be calculated to higher accuracy than with the equation (32) and with simpler processing than with the equation (7).

[Equation 33]

$$Z_r^{(l)''} = F_{la+r} + \sum_{j=0}^{a-1} \left\{ \begin{array}{c} \sum_{\substack{i=0 \\ r \ne \mu'(i,j)}}^{m-1} (-1)^{P_1(L,r) \oplus P_2(i,j)} h_{r+j}^{(i,l)} L_{j,1}^{(i)} + \\ \sum_{\substack{i=0 \\ r = \mu'(i,j)}}^{m-1} (-1)^{P_1(L,r) \oplus P_2(i,j)} h_{r+j}^{(i,l)} L_{j,2}^{(i)} \end{array} \right\} \qquad (33)$$

In the equation (33), u'(i,j) is an integer from 0 to a−1. The check-to-variable processing unit block 62 outputs u'(i,j) at a timing similar to that of the first exemplary embodiment, that is, at a timing when the value of $L_{1-out}$ of the previous stage, entered as $L_{1-in}$, has become of the smallest value. It should be noted that u'(i,j) is reduced in the information volume as compared to the case where μ(i,j) in the equations (7) and (25) of the first exemplary embodiment denotes a set of an integer between 0 and n−1 and an integer between 0 and a−1, thus correspondingly lowering the calculation accuracy of the variable-to-check message data.

The basic configurations of the check-to-variable processing unit block 62 and the variable-to-check processing unit block 32 are the same as FIGS. 7 and 4 for the first exemplary embodiment. It is however possible to reduce the bit width of each register 61 in the check-to-variable register block 51 and hence the size of the entire decoding apparatus.

As discussed above, if the equation (33) is used, the balance between the calculation accuracy and the size of the device in the trade-off between the calculation accuracy and the size of the device may be selected, subject to selection of μ(s,t), out of three alternatives (using μ(s,t) as in the first exemplary embodiment, using μ'(i,j) as in the second exemplary embodiment or not using μ).

First Exemplary Embodiment

Figure 12:
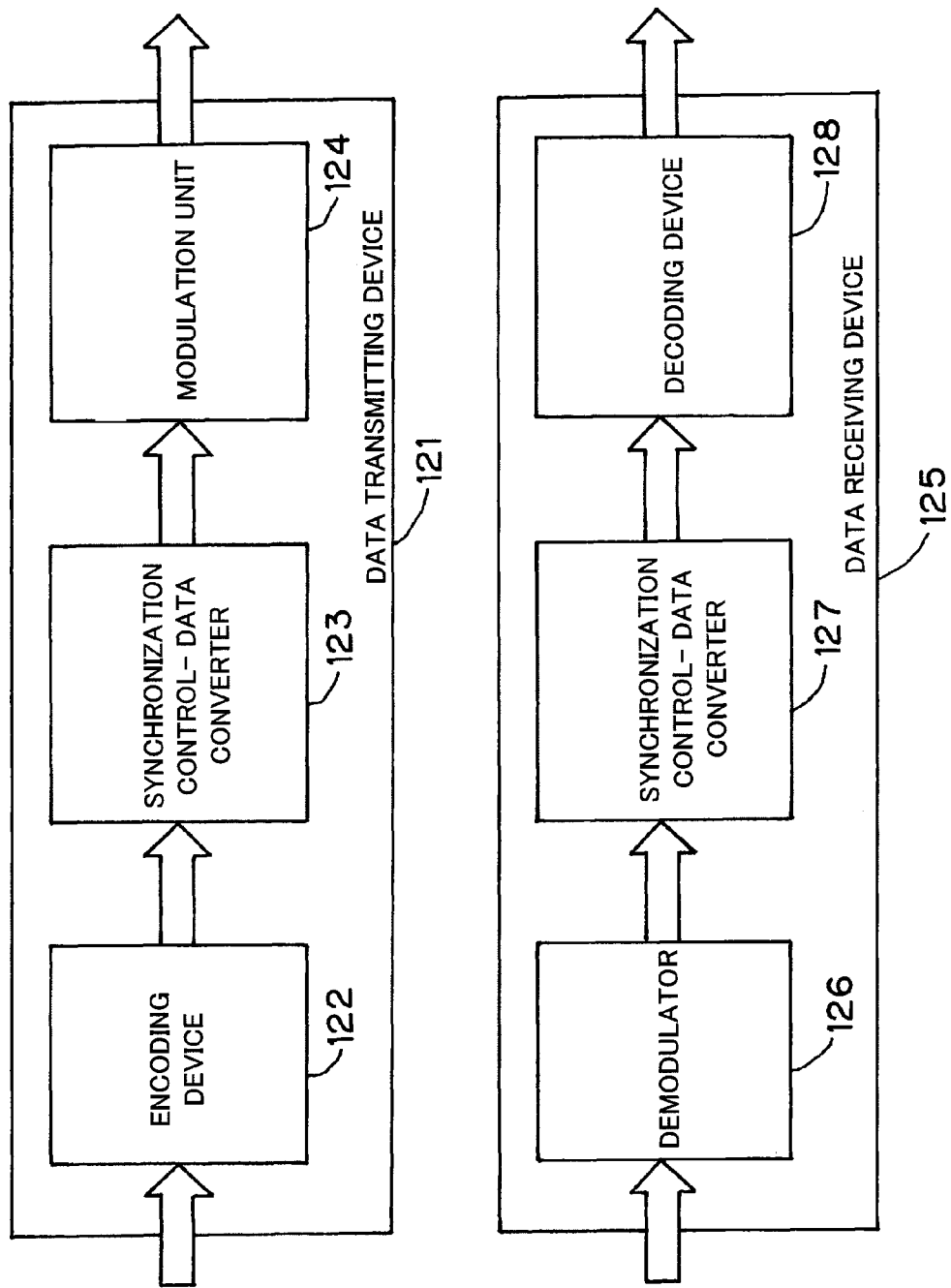
FIG. 12 is a block diagram showing an example of the configuration of a data communication (storage) device employing the decoding apparatus according to the present invention.

FIG. 12 is a block diagram showing an example of the configuration of a data communication (storage) device employing a decoder 128 of the present invention.

The data communication (storage) device includes a data transmitting device 121 and a data receiving apparatus (receiver) 125. The data transmitting device 121 includes an encoder 122 for pseudo cyclic low density parity check codes, a synchronization controller/data converter (synchronization controller-data converter) 123 for frame synchronization control and for conversion into data matched to a modulator 124, and the modulator 124. The modulator 124 outputs the information to a communication path or to a memory.

The data receiving apparatus 125 includes a demodulator 126 for demodulating the information received from the communication path or from the memory, a synchronization control-data converter 127 for converting output data of the demodulator 126 into input data of the decoder 126 and for taking frame synchronization, and the decoder 128 of the present invention.

If, as a numerical example, the total number n of the column blocks of the check matrix is 65, the total number m of the row blocks of the check matrix is 8 and the size a of the cyclic matrix is 63, a bit sequence with a frame length of 4095 bits may be made a frame unit.

It is assumed that, if the weight of the row vector of each block in the check matrix shown by the equation (2) ($f_0^{(i,j)}$, $f_1^{(i,j)}, \ldots f_{a-1}^{(i,j)}$) is less than 1, where i denotes an integer from 0 to 7 and j denotes an integer from 0 to 64. It is also assumed that the number of the variable-to-check processing unit blocks 32 arranged between the neighboring registers 31, out of a plural number of the registers 31 included in each of the 65 variable-to-check register blocks 21, is not more than two.

The processing of hundreds of megabits per second may be implemented with a device size of hundreds of kilogates.

INDUSTRIAL UTILIZABILITY

The present invention may be utilized as an error correction technique for satisfying requirements for system configuration, such as reduction of needed power in satellite communication or mobile communication systems or reduction of the antenna size. The present invention may also be utilized as error correction technique for improving reliability of memory devices, such as those by magnetic recording.

The invention claimed is:

1. A decoding apparatus that decodes pseudo cyclic low density parity check codes in error correction coding and outputs an estimated transmission bit sequence which is the result of decoding, said apparatus comprising:
    variable-to-check message generating means including a plurality of feedback shift registers of a predetermined number of stages including a plurality of registers; said variable-to-check message generating means receiving a sequence of received data, generating and outputting a variable-to-check message and an estimated transmission bit sequence; said variable-to-check message comprising data inclusive of a sum of a log likelihood ratio and an a-priori value;
    check-to-variable message generating means including a plurality of feedback shift registers of a preset number of stages including a plurality of registers; said check-to-variable message generating means outputting, on receipt of the variable-to-check message, output from said variable-to-check message generating means, a check-to-variable message including data generated responsive to said variable-to-check message received; and
    normalization processing means that multiplies preset data included in said check-to-variable message output by said check-to-variable message generating means with a preset constant and outputs the resulting product to said variable-to-check message generating means;
    wherein said variable-to-check message generating means includes variable-to-check processing means that sums data corresponding to an output of said check-to-variable message generating means to preset data out of data retained in the registers of said feedback shift register included in said variable-to-check message generating means, saves the resulting sum in the next stage register, and outputs at a preset timing, the estimated transmission bit sequence and a variable-to-check message including data retained in said register; and
    wherein said check-to-variable message generating means includes check-to-variable processing means that selects two data out of the data retained by said registers of said feedback shift register of said check-to-variable message generating means, and data of the smallest value and data of the second smallest value out of the data output by said variable-to-check processing means, saves the data selected in the next stage register and outputs the data retained in said register at a preset timing as check-to-variable message;
    said variable-to-check message generating means being arranged between the registers of said feedback shift register of said check-to-variable message generating means;
    said check-to-variable message generating means being arranged between the registers of said feedback shift register of said check-to-variable message generating means.

2. The decoding apparatus according to claim 1, wherein said variable-to-check message generating means includes a first clock counter synchronized with an operating clock of said feedback shift register of said variable-to-check message generating means; and
    said check-variable message generating means including a second clock counter synchronized with an operating clock of said feedback shift register of said check-to-variable message generating means;
    said variable-to-check processing means selecting, responsive to a count value of said first clock counter, the data to be summed to a part of the data retained in the register of said variable-to-check message generating means;
    the register of said check-to-variable message generating means retaining a count value of said second clock counter;
    said check-to-variable processing means outputting, when data corresponding to the output of said variable-to-check message generating means has become of the smallest value, a numerical value corresponding to the count value of said second clock counter retained by said register to cause the output value to be retained in the next stage register.

3. The decoding apparatus according to claim 1, wherein said variable-to-check message generating means includes a first clock counter synchronized with an operating clock of said feedback shift register of said variable-to-check message generating means;
    said check-variable message generating means including a second clock counter synchronized with an operating clock of said feedback shift register of said check-to-variable message generating means;
    said variable-to-check processing means selecting, responsive to a count value of said first clock counter and a numerical value allocated to the register of said variable-to-check message generating means, the data to be summed to a part of the data retained in the register of said feedback register of said variable-to-check message generating means;
    the register of said check-to-variable message generating means retaining a count value of said second clock counter;
    said check-to-variable processing means outputting, when data corresponding to the output of said variable-to-check message generating means has become of the smallest value, a set of the count value of said second clock counter retained by said register and a numerical value allocated to the register of said variable-to-check message generating means.

4. The decoding apparatus according to claim 1, wherein said variable-to-check message generating means and said check-to-variable message generating means repeat generation and outputting of said variable-to-check message and generation and outputting of said check-to-variable message a preset number of times;
said variable-to-check message generating means outputting an estimated transmission bit sequence after repeating the generation of said variable-to-check message said preset number of times.

5. The decoding apparatus according to claim 1, wherein said variable-to-check message generating means includes the same numbers of said registers and said check-to-variable processing means as the size of a cyclic matrix constituting a check matrix of pseudo cyclic low density parity check codes; and wherein
said check-to-variable message generating means includes the same numbers of said registers and said check-to-variable processing means as the size of a cyclic matrix constituting a check matrix of said pseudo cyclic low density parity check codes.

6. The decoding apparatus according to claim 1, wherein said variable-to-check generating means includes:
the same number of variable-to-check register blocks as the total number n of column blocks of a check matrix;
an adder; and
a first clock counter synchronized with the clock of a register included in said variable-to-check register block;
an output of said variable-to-check register block being summed by said adder to a part of the sequence of received data equivalent to a column block of the check matrix corresponding to said variable-to-check register block; the result of summation being output; wherein
said variable-to-check register block includes:
the same number of stages of registers equal to the size a of the cyclic matrix constituting said check matrix;
a plurality of variable-to-check processing means arranged between said registers; and
an output switch that receives an output of the register of the last stage and switches between connection to an input of the first stage register and delivery to an input of said adder
said variable-to-check register block receiving the same number of sequences of data sequences as the number m of row blocks of the check matrix;
said variable-to-check register block further including
connection switch means that determines, by m bit sequences, each composed of a bits, predetermined by said check matrix, whether or not an input to said variable-to-check register block is to be supplied as input to said variable-to-check processing means;
said variable-to-check processing means selecting data summed to input message data based on a count value of said first counter; the information retained and updated in said register by said variable-to-check processing means including data corresponding to a variable-to-check message (VC message) and the information representing the plus or minus of data of a message part computed by said variable-to-check processing means.

7. The decoding apparatus according to claim 6, wherein the same number of variable-to-check processing means as the number of '1's contained in a check matrix $\{h_r^{(0,l)}, h_r^{(1,l)}, h_r^{(2,l)}, \ldots, h_r^{(m-1),l}\}$, are provided between the r'th register and the (r+1)th register in the l'th variable-to-check register block, where l and r indicate an integer between 0 and n−1 and an integer between 0 and a−1, respectively.

8. The decoding apparatus according to claim 6, wherein said variable-to-check processing means receives cnt, µ and first and second data $L_1$, $L_2$, $P_2$, $P_{1\text{-}in}$ and $Z_{in}$ equivalent to a check-to-variable message
(where µ, $L_1$, $L_2$, and $P_2$ correspond to µ(i,j), $L_{j,1}^{(s)}$, $L_{j,2}^{(s)}$ and $P_2(i,j)$ in the equation $$Z_r^{(l)}(j) = Z_{r+1}^{(l)}(j+1) + \sum_{\substack{i=0 \\ (l,r-j) \neq \mu(i,j)}}^{m-1} (-1)^{P_1(l,r+1)_{j+1} \oplus P_2(i,j)} h_r^{(i,l)} L_{j,1}^{(i)} + \sum_{\substack{i=0 \\ (l,r-j) = \mu(i,j)}}^{m-1} (-1)^{P_1(l,r+1)_{j+1} \oplus P_2(i,j)} h_r^{(i,l)} L_{j,2}^{(i)}$$

which gives message data $Z_r^{(l)}(j)$ at time point (a−j) in case an initial state (value at time point 0) of message data saved in an r'th register is represented as $Z_r^{(l)}(a)$ and cnt denotes a set of an integer l between 0 and n−1, predetermined from one variable-to-check register block to another, and a set of an integer between 0 and a−1 corresponding to a value of the counter synchronized with the clock; said variable-to-check processing means including:
a comparator that receives cnt and µ;
a selector that receives $L_1$ and $L_2$ as input and outputs one of $L_1$ and $L_2$ with an output of said comparator as a selection control signal;
an exclusive-OR that receives $P_2$ and $P_{1\text{-}in}$;
a plus-minus inverter that receives an output of said selector and inverts the polarity of the output of said selector based on an output of said exclusive-OR; and
an adder that sums $Z_{in}$ and an output of said plus-minus inverter and outputs the result of summation as $Z_{1\text{-}out}$;
said variable-to-check processing means outputting, for inputs $Z_{in}$ and $P_{1\text{-}in}$, $Z_{1\text{-}out}$ and $P_{1\text{-}out}$ represented by the following equations:

$$Z_{1\text{-}out} = \begin{cases} Z_{1\text{-}in} + (-1)^{P_{1\text{-}in} \oplus P_2} L_1 & \text{when } cnt \neq \mu \\ Z_{1\text{-}in} + (-1)^{P_{1\text{-}in} \oplus P_2} L_2 & \text{when } cnt = \mu \end{cases}$$

$$P_{1\text{-}out} = P_{1\text{-}in}$$

and delivering $Z_{1\text{-}out}$ and $P_{1\text{-}out}$ as $Z_{in}$ and via said register to the next stage variable-to-check processing means.

9. The decoding apparatus according to claim 8, wherein said comparator and said selector are deleted from said variable-to-check processing means; wherein there are provided said exclusive-OR, plus-minus inverter and said adder; and wherein $L_2$, $P_2$, $P_{1\text{-}in}$ and $Z_{in}$ are input, and $V_{1\text{-}out}$ and $P_{1\text{-}out}$ are output.

10. The decoding apparatus according to claim 1, wherein said check-to-variable processing means includes:
the same number of check-variable register blocks as the total number m of row blocks of the check matrix; and
a second clock counter which is a counter synchronized with the clock of the register in said check-to-variable register block;

said check-to-variable register block including
the same number of stages of registers as the size of the cyclic matrix constituting the check matrix;
check-to-variable processing means provided between neighboring ones of said registers;
connection switch means for determining, based on n bit sequences, each made up of a bits, as determined from the outset by said check matrix, whether or not an input to said check-variable register block is to be supplied to said check-to-variable processing means, and
an output switch that switches between outputting the last stage register to an input of the first stage register or to said normalization processing means; wherein,
in said check-to-variable register block, the information retained and updated in said register by said check-to-variable processing means includes data equivalent to a check-to-variable message (CV message), a value of said second clock counter and the information computed by said variable-to-check message generating means and representing the syndrome for the hard decision result of the message supplied to said check-to-variable message generating means.

11. The decoding apparatus according to claim 10, wherein the same number of said check-to-variable processing means as the number of '1's contained in $\{gt^{(s,0)}, gt^{(s,1)}, gt^{(s,2)}, \ldots, gt^{(s,n-1)}\}$ of a matrix G ($G^T H = 0$ with regard to the check matrix H, $G^T$ being a transposed matrix of G) are provided between the t'th register and the (t+1)th register in the s'th check-to-variable register block, where s and t denote an integer between 0 and m−1 and an integer between 0 and a−1, respectively.

12. The decoding apparatus according to claim 10, wherein said check-to-variable processing means receives Z, cnt, $P_{2-in}$, $\mu_{in}$, $L_{1-in}$ and $L_{2-in}$, as inputs; said check-to-variable processing means including:
an exclusive-OR that receives, as input, the information indicating the plus or minus of $P_{2-in}$ and Z;
a first comparator that receives, as inputs, $L_{2-in}$ and an absolute value of Z;
a second comparator that receives, as inputs, $L_{1-in}$ and an absolute value of Z;
a first selector that receives the absolute value of Z, $L_{1-in}$ and $L_{2-in}$ as inputs, receives an output of said first comparator as selection control signal and changes over an output thereof depending on the output result of said first comparator to deliver $L_{1-out}$ and $L_{2-out}$ as outputs; and
a second selector that receives cnt and $\mu_{in}$ as inputs, receives an output of said second comparator as selection control signal, changes over an output thereof depending on the output result of said second comparator and outputs $\mu_{out}$; wherein Z corresponds to $Z_{j-1}$;
cnt denotes a set of an integer between 0 and n−1 and an integer between 0 and a−1 which corresponds to the counter value synchronized with the clock; said check-to-variable processing unit block outputting, for inputs $L_{1-in}$, $L_{2-in}$, $P_{2-in}$ and $\mu_{in}$, $L_{1-out}$, $L_{2-out}$, $P_{2-out}$ and $\mu_{out}$ represented by the following equations:

$$L_{1-out} = \begin{cases} |Z| & \text{when } |Z| < L_{1-in} \\ L_{1-in} & \text{when } |Z| \geq L_{1-in} \end{cases}$$

$$L_{2-out} = \begin{cases} L_{1-in} & \text{when } |Z| < L_{1-in} \\ |Z| & \text{when } L_{1-in} \leq |Z| < L_{2-in} \\ L_{2-in} & \text{when } L_{2-in} \leq |Z| \end{cases}$$

-continued $$P_{2-out} = \begin{cases} P_{2-in} \oplus 1 & \text{when } |Z| > 0 \\ P_{2-in} & \text{when } Z \leq 0 \end{cases}$$

$$\mu_{out} = \begin{cases} cnt & \text{when } |Z| < L_{1-in} \\ \mu_{in} & \text{when } |Z| \geq L_{1-in} \end{cases}.$$

13. The decoding apparatus according to claim 12, wherein said comparator and said selector are deleted from said check-to-variable processing means; wherein there are provided said exclusive-OR, first and second comparators and said first selector; and wherein Z, $P_{2-in}$, $L_{1-in}$ and $L_{2-in}$ are input and $L_{1-out}$, $L_{2-out}$ and $P_{2-out}$ are output.

14. A receiving apparatus including a decoding apparatus according to claim 1.

15. A receiving apparatus including a decoding apparatus that decodes pseudo cyclic low density parity check codes in error correction coding and outputs an estimated transmission bit sequence, said receiving apparatus comprising:
a demodulator that demodulates and outputs information received; and
a synchronization control-data conversion device that converts output data of said demodulator into input data of a form matched to said decoding apparatus;
said decoding apparatus including:
variable-to-check message generating means including a plurality of feedback shift registers of a predetermined number of stages including a plurality of registers; said variable-to-check message generating means receiving a sequence of received data, generating and outputting a variable-to-check message and an estimated transmission bit sequence; said variable-to-check message comprising data inclusive of a sum of a log likelihood ratio and an a-priori value;
check-to-variable message generating means including a plurality of feedback shift registers of a preset number of stages including a plurality of registers; said check-to-variable message generating means outputting, on receipt of the variable-to-check message, output from said variable-to-check message generating means, a check-to-variable message inclusive of data generated responsive to said variable-to-check message received; and
normalization processing means that multiplies preset data included in said check-to-variable message output by said check-to-variable message generating means with a preset constant and outputs the resulting product to said variable-to-check message generating means;
said variable-to-check message generating means including variable-to-check processing means that sums data corresponding to an output of said check-to-variable message generating means to preset data out of data retained in the registers of said feedback shift register included in said variable-to-check message generating means, saves the resulting sum in the next stage register, and outputs, at a preset timing, the estimated transmission bit sequence and the variable-to-check message including data retained in said register;
said check-to-variable message generating means including check-to-variable processing means that selects two data out of the data retained by said registers of said feedback shift register of said check-to-variable message generating means, and data of the smallest value and data of the second smallest value out of the data output by said variable-to-check processing means, saves the data selected in the next stage register and outputs the data retained in said register at a preset timing as check-to-variable message;

said variable-to-check processing means being arranged between the registers of said feedback shift register of said check-to-variable message generating means;

said check-to-variable processing means being arranged between the registers of said feedback shift register of said check-to-variable message generating means.

16. A decoding apparatus that decodes pseudo cyclic low density parity check codes in error correction coding and outputs an estimated transmission bit sequence which is the result of decoding, said apparatus including:

variable-to-check message generating means that receives a sequence of received data, and generates and outputs a variable-to-check message (VC message) and an estimated transmission bit sequence; said variable-to-check message comprising data inclusive of a sum of a log likelihood ratio and an a-priori value; and a check-to-variable message generating means that outputs a check-to-variable message (CV message) including data generated, responsive to said variable-to-check message;

said decoding apparatus decoding pseudo cyclic low density parity check codes in error correction coding and outputting an estimated transmission bit sequence which is the result of decoding;

wherein said variable-to-check generating means includes:

the same number of variable-to-check register blocks as the total number n of column blocks of a check matrix;

an adder; and a first clock counter synchronized with the clock of a register included in said variable-to-check register block;

an output of said variable-to-check register block being summed by said adder to a part of the sequence of received data equivalent to a column block of the check matrix corresponding to said variable-to-check register block; the result of summation being output; wherein said variable-to-check register block includes:

the same number of stages of registers as the size a of the cyclic matrix constituting said check matrix;

a plurality of variable-to-check processing means arranged between said registers; and an output switch that receives an output of the last stage register and switches between connection to an input of the first stage register and delivery to an input of said adder said variable-to-check register block receiving the same number of sequences of data sequences as the number m of row blocks of the check matrix;

said variable-to-check register block further including connection switch means that determines, by m bit sequences, each composed of a bits, predetermined by said check matrix, whether or not an input to said variable-to-check register block is to be supplied as input to said variable-to-check processing means;

said variable-to-check processing means selecting data summed to input message data based on a count value of said first counter;

the information retained and updated in said register by said variable-to-check processing means including data corresponding to a variable-to-check message and the information representing the plus or minus of data of a message part computed by said variable-to-check processing means; wherein said check-to-variable message generating means includes:

the same number of check-to-variable register blocks as the total number m of row blocks of said check matrix; and a second clock counter synchronized with the clock of the register included in said check-to-variable register block;

said check-variable register block including the same number of stages of registers as the size of a cyclic matrix constituting said check matrix;

check-to-variable processing means arranged between neighboring ones of said registers;

connection switch means that determines, by n bit sequences, each composed of a bits, predetermined by said check matrix, whether or not an input to said check-to-variable register block is to be supplied as input to said check-to-variable processing means; and an output switch that switches between feedback-connecting an output of the last stage register to an input of the initial stage register and delivery as output of the output of the last stage register; wherein, in said check-variable register block, the information retained and updated in said register by said check-to-variable processing means includes data equivalent to a check-to-variable message (CV message), the count value of said second clock counter and the information computed by said check-to-variable message generating means and representing the syndrome for the hard decision result of the message supplied to said check-to-variable message generating means.

* * * * *

UNITED STATES PATENT AND TRADEMARK OFFICE
CERTIFICATE OF CORRECTION

PATENT NO. : 8,074,142 B2
APPLICATION NO. : 12/088142
DATED : December 6, 2011
INVENTOR(S) : Norifumi Kamiya It is certified that error appears in the above-identified patent and that said Letters Patent is hereby corrected as shown below:

In the Specification

Column 13, Line 61: delete "1'th" and insert -- l'th --

Column 19, Line 19: After "blocks" insert -- 32 --

Column 22, Line 29: delete "u'(i,j)" and insert -- $\mu'(i,j)$ --

Column 22, Line 30: delete "u'(i,j)" and insert -- $\mu'(i,j)$ --

Column 22, Line 34: delete "u'(i,j)" and insert -- $\mu'(i,j)$ --

In the Claims

Column 26, Line 40: In Claim 8, after "$Z_{in}$ and" insert -- $P_{1\text{-}in}$ --

Signed and Sealed this
Twenty-second Day of July, 2014

Michelle K. Lee
*Deputy Director of the United States Patent and Trademark Office*